(12) United States Patent
Akutsu et al.

(10) Patent No.: US 11,342,348 B2
(45) Date of Patent: May 24, 2022

(54) NON-VOLATILE SEMICONDUCTOR MEMORY DEVICE AND MANUFACTURING METHOD THEREOF

(71) Applicant: KIOXIA CORPORATION, Tokyo (JP)

(72) Inventors: Yoshihiro Akutsu, Yokkaichi (JP); Ryota Katsumata, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 11 days.

(21) Appl. No.: 16/932,189

(22) Filed: Jul. 17, 2020

(65) Prior Publication Data
US 2020/0350327 A1 Nov. 5, 2020

Related U.S. Application Data

(63) Continuation of application No. 16/176,634, filed on Oct. 31, 2018, now Pat. No. 10,748,916, which is a (Continued)

(51) Int. Cl.
*H01L 27/11556* (2017.01)
*H01L 21/768* (2006.01)
(Continued)

(52) U.S. Cl.
CPC ...... *H01L 27/11556* (2013.01); *H01L 21/743* (2013.01); *H01L 21/76889* (2013.01);
(Continued)

(58) Field of Classification Search
CPC ......... H01L 27/11524; H01L 27/11582; H01L 27/115; H01L 27/11521; H01L 29/66825;
(Continued)

(56) References Cited

U.S. PATENT DOCUMENTS 8,008,710 B2   8/2011   Fukuzumi
8,338,882 B2   12/2012  Tanaka et al.
(Continued)

FOREIGN PATENT DOCUMENTS

JP   2011-187794   9/2011
JP   2012-142558   7/2012
JP   2013-21322    1/2013

*Primary Examiner* — Shaun M Campbell

(74) *Attorney, Agent, or Firm* — Oblon, McClelland, Maier & Neustadt, L.L.P.

(57) ABSTRACT

This non-volatile semiconductor memory device includes a memory cell array including NAND cell units formed in a first direction vertical to a surface of a semiconductor substrate. A local source line is electrically coupled to one end of the NAND cell unit formed on the surface of the substrate. The memory cell array includes: a laminated body where plural conductive films, which are to be control gate lines of memory cells or selection gate lines of selection transistors, are laminated sandwiching interlayer insulating films; a semiconductor layer that extends in the first direction; and an electric charge accumulating layer sandwiched between: the semiconductor layer and the conductive film. The local source line includes a silicide layer. The electric charge accumulating layer is continuously formed from the memory cell array to cover a peripheral area of the silicide layer.

9 Claims, 21 Drawing Sheets

Related U.S. Application Data continuation of application No. 15/677,361, filed on Aug. 15, 2017, now Pat. No. 10,134,751, which is a continuation of application No. 15/151,846, filed on May 11, 2016, now Pat. No. 9,768,185, which is a continuation of application No. 14/645,793, filed on Mar. 12, 2015, now Pat. No. 9,362,298.

(60) Provisional application No. 62/049,017, filed on Sep. 11, 2014.

(51) Int. Cl.

| | | |
|---|---|---|
| *H01L 21/74* | (2006.01) | |
| *H01L 27/11582* | (2017.01) | |
| *H01L 27/1157* | (2017.01) | |
| *H01L 27/11578* | (2017.01) | |
| *H01L 23/535* | (2006.01) | |
| *H01L 27/11573* | (2017.01) | |
| *H01L 25/00* | (2006.01) | |

(52) U.S. Cl.
CPC .......... *H01L 23/535* (2013.01); *H01L 25/00* (2013.01); *H01L 27/1157* (2013.01); *H01L 27/11573* (2013.01); *H01L 27/11578* (2013.01); *H01L 27/11582* (2013.01); *H01L 2924/0002* (2013.01)

(58) Field of Classification Search
CPC .......... H01L 27/11578; H01L 27/1157; H01L 29/7881; H01L 2924/0002; H01L 29/66833; H01L 29/792; H01L 29/7926; H01L 21/28273; H01L 27/11556; H01L 27/11529; H01L 27/11565; H01L 27/11573; H01L 27/11575; H01L 27/11519; H01L 2924/00; H01L 27/11568; H01L 29/788; H01L 21/7682; H01L 21/76877; H01L 27/11526; H01L 29/42324; H01L 21/76229; H01L 23/5226; H01L 27/11517; H01L 29/42336; H01L 29/4991; H01L 21/28282; H01L 21/764; H01L 21/76831; H01L 23/53266; H01L 27/11551; H01L 29/0673; H01L 29/4234; H01L 29/775; H01L 29/78696; H01L 21/743; H01L 21/76805; H01L 21/76838; H01L 21/76846; H01L 21/76885; H01L 21/76889; H01L 21/8221; H01L 23/485; H01L 23/528; H01L 23/535; H01L 27/105; H01L 27/1052; H01L 27/11534; H01L 27/11546; H01L 27/1203; H01L 27/2481; H01L 28/20; H01L 21/02532; H01L 21/28518; H01L 21/324; H01L 21/76224; H01L 21/76801; H01L 21/76802; H01L 21/76804; H01L 21/76819; H01L 21/76832; H01L 21/76849; H01L 21/76855; H01L 21/76895; H01L 21/823857; H01L 23/564; H01L 23/585; H01L 27/0629; H01L 27/0688; H01L 27/10885; H01L 27/10888; H01L 27/11514; H01L 27/11548; H01L 2924/1438; H01L 29/0649; H01L 29/1037; H01L 29/1054; H01L 29/24; H01L 29/42332; H01L 29/515; H01L 29/7883; H01L 29/7887; H01L 29/7889; G11C 16/0483; G11C 16/04; G11C 16/26; G11C 16/0433; G11C 16/0416; G11C 16/12; G11C 16/24; G11C 16/30; B82Y 10/00
See application file for complete search history.

(56) References Cited

U.S. PATENT DOCUMENTS

| | | |
|---|---|---|
| 8,530,956 B2 | 9/2013 | Lee |
| 9,362,298 B2 | 6/2016 | Akutsu |
| 9,768,185 B2 | 9/2017 | Akutsu |
| 10,134,751 B2 * | 11/2018 | Akutsu ............... H01L 27/1157 |
| 10,748,916 B2 * | 8/2020 | Akutsu ................... H01L 25/00 |
| 2007/0252201 A1 * | 11/2007 | Kito ...................... H01L 27/105 |
| | | 257/331 |
| 2008/0173928 A1 | 7/2008 | Arai |
| 2011/0002178 A1 | 1/2011 | Hwang |
| 2012/0241844 A1 | 9/2012 | Iguchi |
| 2013/0009235 A1 | 1/2013 | Yoo |
| 2015/0364488 A1 | 12/2015 | Pachamuthu |

* cited by examiner

NON-VOLATILE SEMICONDUCTOR MEMORY DEVICE AND MANUFACTURING METHOD THEREOF

CROSS REFERENCE TO RELATED APPLICATIONS

This application is a continuation of U.S. patent application Ser. No. 16/176,634 filed Oct. 31, 2018, which is a continuation of U.S. patent application Ser. No. 15/677,361 filed Aug. 15, 2017, which is a continuation of U.S. patent application Ser. No. 15/151,846 filed May 11, 2016, which is a continuation of U.S. patent application Ser. No. 14/645,793 filed Mar. 12, 2015, which is based on and claims the benefit of priority from prior U.S. Provisional Patent Application No. 62/049,017, filed on Sep. 11, 2014, the entire contents of each of which are incorporated herein by reference.

FIELD

Embodiments described herein relate to a non-volatile semiconductor memory device and a manufacturing method of the non-volatile semiconductor memory device.

BACKGROUND

Recently, in the field of NAND-type flash memories, attention has been focused on a laminated-type (three-dimensional) NAND-type flash memory as a device that can achieve high integration without being restricted by the limit of resolution of the lithography technology. This type of three-dimensional NAND-type flash memory includes a laminated body and a semiconductor layer. In the laminated body, a plurality of conductive films and interlayer insulating films are alternately laminated. The conductive film functions as word lines and selection gate lines. The semiconductor layer is formed to pass through these laminated films. This semiconductor layer functions as a body of a memory string. Between the semiconductor layer and the conductive film, a memory film that includes an electric charge accumulating layer is formed.

This three-dimensional NAND-type flash memory has a large number of wirings and contacts for coupling various wirings and an external circuit together. Accordingly, it is required to reduce the resistance values of these portions.

DETAILED DESCRIPTION

A non-volatile semiconductor memory device according to the embodiments described as follows includes a memory cell array including NAND cell units arranged therein. The NAND cell unit is configured to extend in a first direction vertical to a surface of a semiconductor substrate. The NAND cell unit includes plurality of memory cells and selection transistors connected in series. A local source line is formed on the surface of the semiconductor substrate, and is electrically coupled to one end of the NAND cell unit. The memory cell array includes a laminated body, a semiconductor layer, and a memory film. In the laminated body, a plurality of conductive films are laminated sandwiching an interlayer insulating film. The conductive film becomes control gate lines of the memory cell or selection gate lines of the selection transistor. The semiconductor layer extends in the first direction. The memory film includes an electric charge accumulating layer sandwiched between the semiconductor layer and the conductive film. The local source line includes a silicide layer. The memory film is continuously formed from the memory cell array to cover a peripheral area of the silicide layer.

The following describes non-volatile semiconductor memory devices according to embodiments in detail with reference to the accompanying drawings. Here, these embodiments are only examples, and are not described for the purpose of limiting the present invention. The respective drawings of the non-volatile semiconductor memory devices used in the following embodiments are schematically illustrated. The thickness, the width, the ratio, and similar parameter of the layer are different from actual parameters.

The following embodiments relate to a non-volatile semiconductor memory device in a structure where a plurality of metal-oxide-nitride-oxide-semiconductor (MONOS) type memory cells (transistors) is disposed in a height direction. The MONOS type memory cell includes: a semiconductor film disposed in a columnar shape vertical to the substrate as a channel, and a gate electrode film disposed on the side surface of the semiconductor film via an electric charge accumulating layer. However, this is not also intended to limit the present invention. The present invention is applicable to, for example, a semiconductor-oxide-nitride-oxide-semiconductor type (SONGS) memory cell or a floating-gate type memory cell.

First Embodiment (Overall Configuration)

Figure 1:
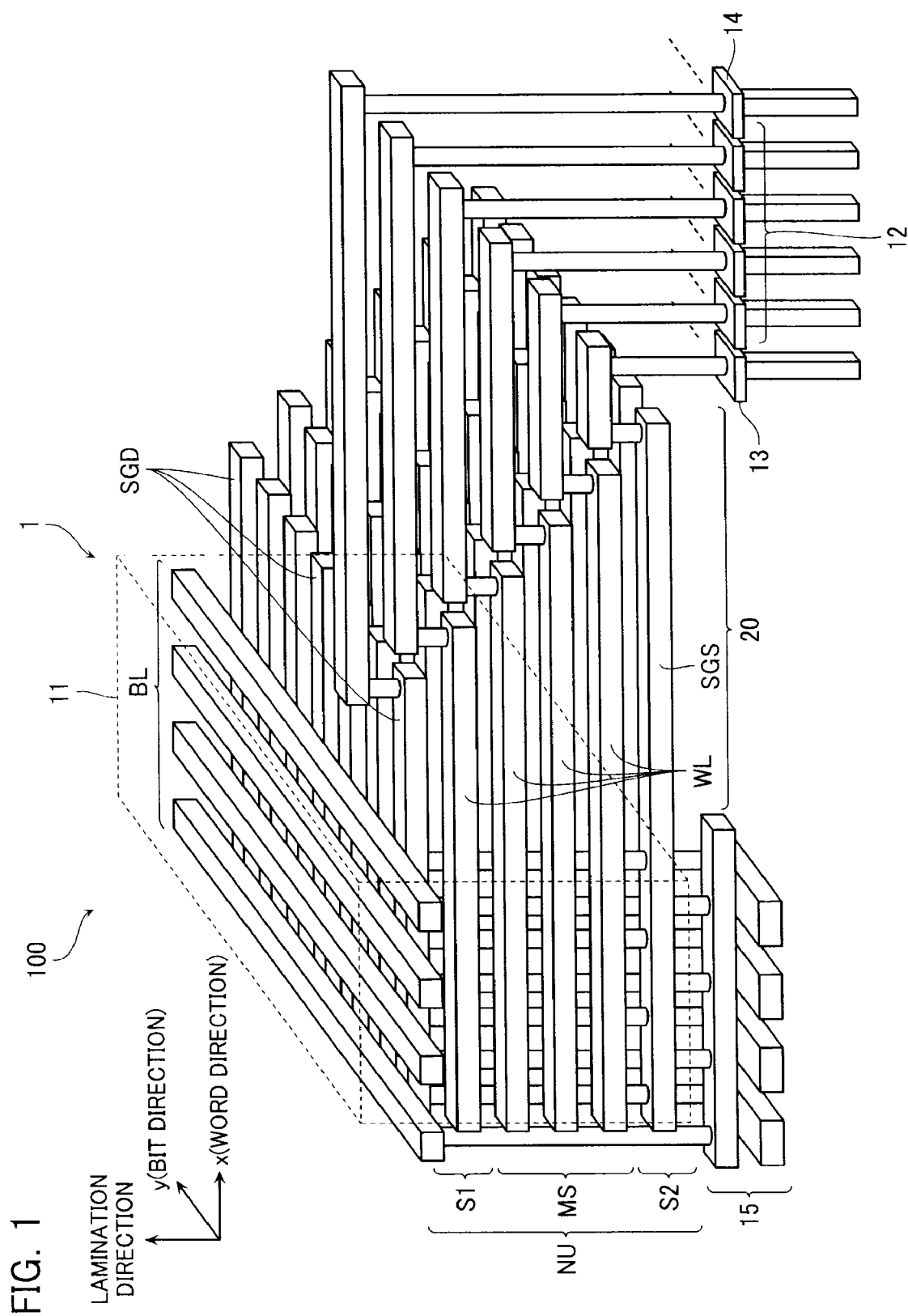
FIG. 1 is a perspective view schematically illustrating an exemplary structure of a non-volatile semiconductor memory device 100 of a first embodiment.

FIG. 1 is a perspective view schematically illustrating an exemplary structure of a non-volatile semiconductor memory device 100 of a first embodiment. The non-volatile semiconductor memory device 100 includes a memory cell array 11, word-line driving circuits 12, source-side selection-gate-line driving circuits 13, drain-side selection-gate-line driving circuits 14, a sense amplifier 15, word lines WL, source-side selection gate lines SGS, drain-side selection gate lines SGD, bit lines BL, a wiring portion 20, and the like.

The memory cell array 11 includes memory strings MS, drain-side selection transistors S1, and source-side selection transistors S2 on a semiconductor substrate (not illustrated in FIG. 1). The memory string MS is constituted such that a plurality of memory cells MC (memory transistors) are coupled together in series. The respective drain-side selection transistor S1 and source-side selection transistor S2 are coupled to both ends of the memory string MS. Here, the series circuit that includes: the memory string MS, and the drain-side selection transistor S1 and the source-side selection transistor S2 coupled to both ends of the memory string MS are hereinafter referred to as a "NAND cell unit NU."

As described later, the memory cell MC has the structure, where a control gate electrode (word line) is disposed on the side surface of a columnar semiconductor film 25, becomes a channel via a memory film 24 including an electric charge accumulating layer. The drain-side selection transistor S1 and the source-side selection transistor S2 each have the structure where a selection gate electrode (selection gate line) is disposed on the side surface of a columnar semiconductor film 25 via the memory film 24 including an electric charge accumulating layer. For simplification of the illustration, FIG. 1 illustrates the case where three memory cells MC are disposed in one memory string MS as the example. Obviously, the number of the memory cells MC in one memory string MS is not limited to this.

The word line WL is coupled in common to the adjacent memory cells along the X direction (the word-line direction) in FIG. 1. The source-side selection gate line SGS is coupled in common to the adjacent source-side selection transistors S2 along the word-line direction. The drain-side selection gate line SGD is coupled in common to the adjacent drain-side selection transistor S1 along the word-line direction. Here, in the following description, the source-side selection gate line SGS and the drain-side selection gate line SGD are collectively referred to simply as "selection gate lines" in some cases. The drain-side selection transistor S1 and the source-side selection transistor S2 are collectively referred to simply as "selection transistors" in some cases. Here, in the memory cells MC in the memory string MS, one or a plurality of the memory cells MC close to the source-side selection gate line SGS and the drain-side selection gate line SGD might be treated as a dummy cell that is not used for data storage. Also in the example described as follows, a description will be given of the example where one dummy cell is disposed at each of both ends of the memory string MS. This, however, should not be construed in a limiting sense. Two or more dummy cells may be disposed or the dummy cell may be omitted.

Furthermore, the bit lines BL are disposed to extend having the longitudinal direction in the Y direction (the bit-line direction) intersecting with the X direction (the word-line direction), and are collocated at a predetermined pitch in the X direction. The bit line BL is coupled to a plurality of the memory strings MS via the drain-side selection transistors S1. Global source lines GSL, which are omitted in FIG. 1, are disposed having the longitudinal direction in the X direction and coupled to the memory strings MS via the source-side selection transistors S2, local source lines LSL described later, and source line contacts LI.

The word-line driving circuit 12 is a circuit that controls the voltage to be applied to the word line WL. The source-side selection-gate-line driving circuit 13 is a circuit that controls the voltage to be applied to the source-side selection gate line SGS. The drain-side selection-gate-line driving circuit 14 is a circuit that controls the voltage to be applied to the drain-side selection gate line SGD. The sense amplifier 15 is a circuit for amplifying a signal (voltage) read out from a selected memory cell to the bit line BL.

The wiring portion 20 is a wiring portion for coupling the word lines WL and the selection gate lines SGD and SGS to the contacts. The word lines WL, the selection gate lines SGS and SGD have a structure processed in a staircase pattern such that the respective upper portions can independently be coupled to the contacts.

(Structure of Memory Cell Array 11)

Figure 2:
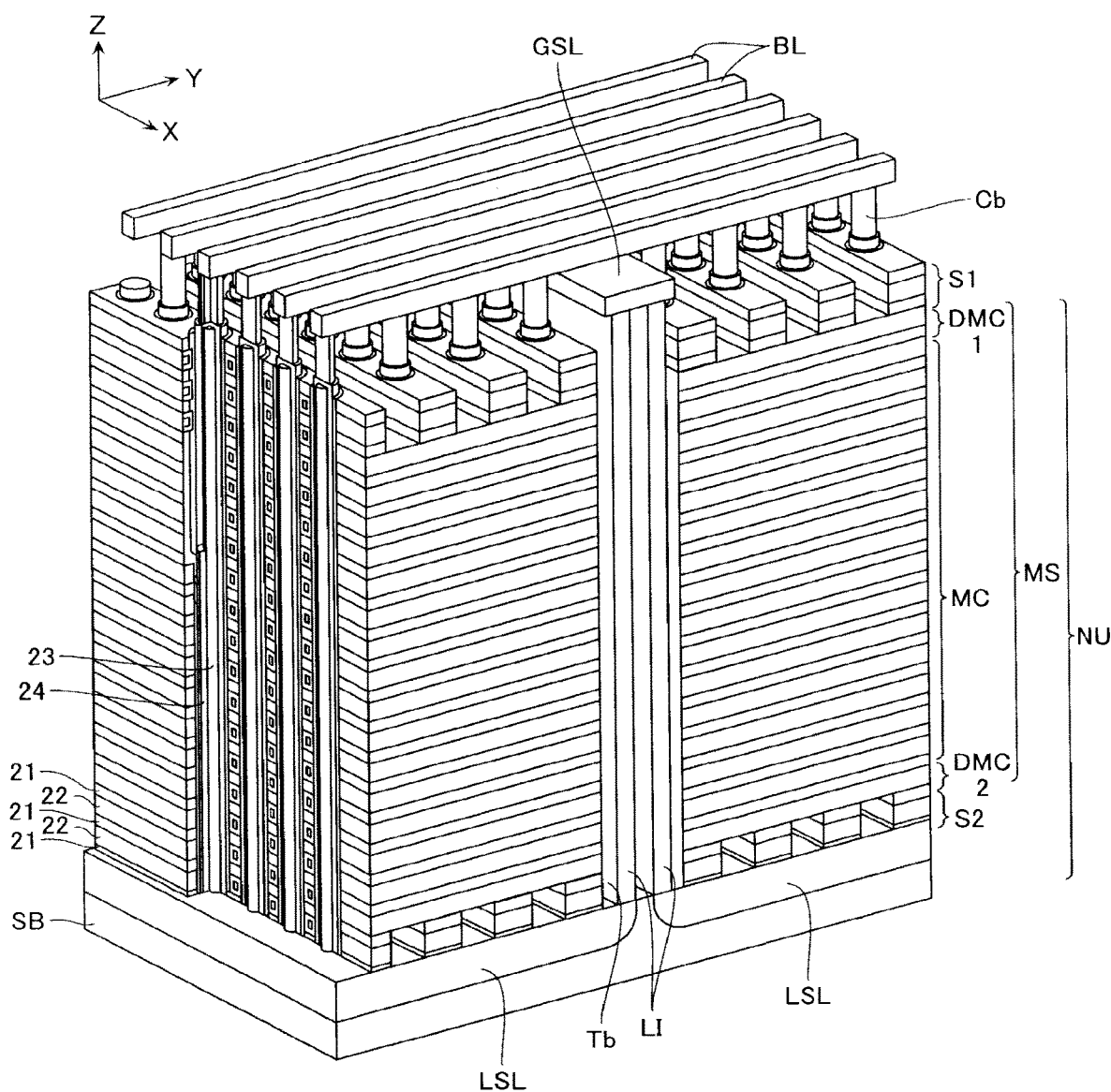
FIG. 2 is a perspective view illustrating a part of a structure of a memory cell array 11.
Figure 3A:
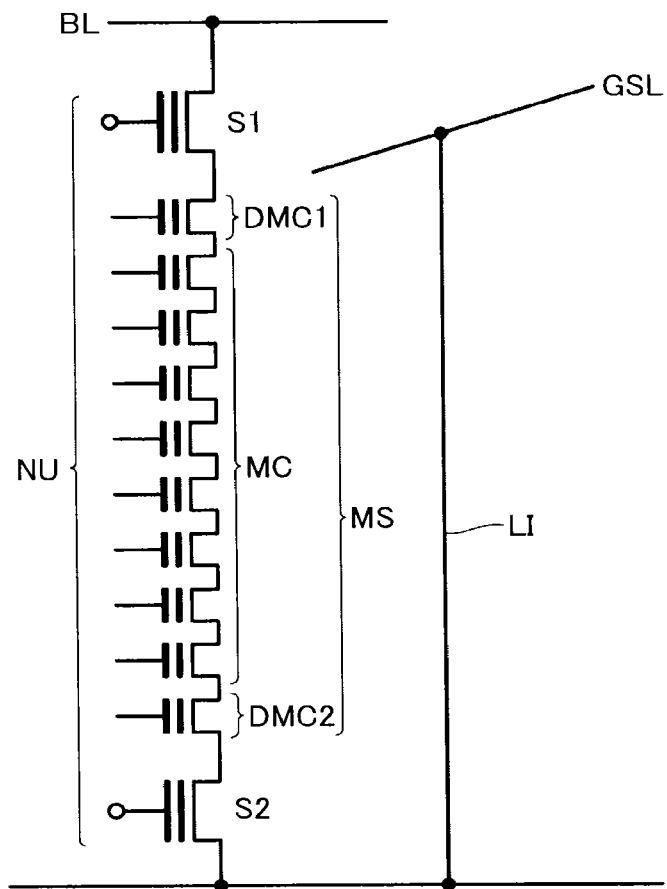
FIG. 3A is an equivalent circuit diagram of one NAND cell unit NU.
Figure 3B:
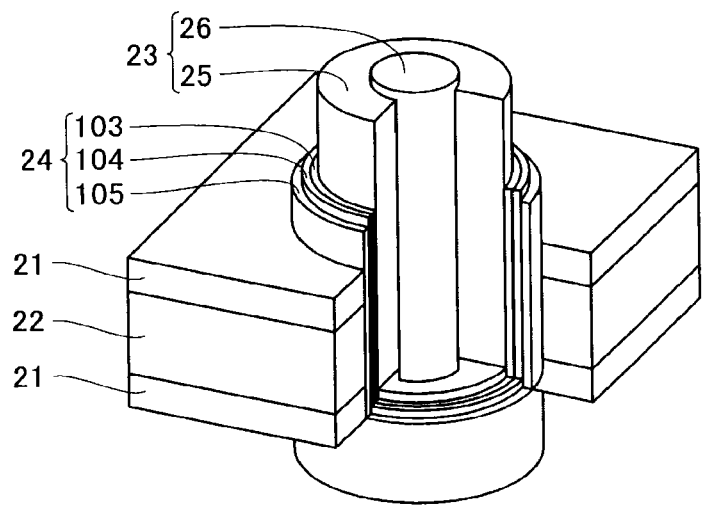
FIG. 3B is a perspective view illustrating one example of a specific structure of one of a memory cell MC or a dummy cell DMC.

The following describes the detail of the structure of the memory cell array 11 with reference to FIG. 2 and FIGS. 3A and 3B. FIG. 2 is a perspective view illustrating the structure of a part of the memory cell array 11. FIGS. 3A and 3B are equivalent circuit diagrams of one NAND cell unit NU.

As illustrated in FIG. 2, the memory cell array 11 has a laminated body 200 where interlayer insulating films 21 and conductive films 22 are alternately laminated on a semiconductor substrate SB. These conductive films 22 function as control gate lines (word lines WL) of the memory cell MC, the source-side selection gate line SGS, and the drain-side selection gate line SGD. The interlayer insulating films 21 are disposed in the up-and-down direction of these conductive films 22 and disposed to electrically insulate the conductive films 22 from one another.

The conductive film 22 can be formed of, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chrome silicide (CrSix), manganese silicide (MnSix), iron silicide (FeSix), ruthenium (Ru), molybdenum (Mo), titanium (Ti), titanium nitride (TiN), vanadium (V), chrome (Cr), manganese (Mn), iron (Fe), cobalt (Co), nickel (Ni), gold (Au), silver (Ag) or copper (Cu), or can be formed of a compound of these materials. The conductive film 22 may be formed of polysilicon with the addition of impurities.

To pass through this laminated body 200 of the interlayer insulating film 21 and the conductive film 22, semiconductor layers 23 having the longitudinal direction in the lamination direction (Z direction) are disposed at a predetermined pitch the XY plane. Between: the semiconductor layer 23; and the conductive film 22 and the interlayer insulating film 21, the memory film 24 including an electric charge accumulating layer is formed. As described later, the memory film 24 is formed along the sidewall of a trench formed to pass through the laminated body 200 and can be formed by a laminated structure of: an electric charge accumulating layer such as a silicon nitride film, and an oxide film such as a silicon oxide film. Depending on the accumulation amount of the electric charge to this electric charge accumulating layer, the threshold voltage of the memory cell MC changes. The memory cell MC holds data corresponding to this threshold voltage.

The semiconductor layers 23 function as the channel regions (body) of the memory cell MC, the dummy cells DMC1 and DMC2, and the selection transistors S1 and S2 that are included in the NAND cell unit NU. These semiconductor layers 23 are coupled, on their upper ends, to the bit lines BL via contacts Cb. The bit lines BL having the longitudinal direction in the Y direction are collocated at a predetermined pitch along the X direction.

The lower end of the semiconductor layer 23 is coupled to the local source line LSL formed on the semiconductor substrate SB. The local source line LSL is coupled to the global source line GSL via the source line contact LI. The laminated body 200 of the interlayer insulating film 21 and the conductive film 22 in the memory cell array 11 are separated by blocks as the smallest unit of data erasure. At the boundary of the separation, a trench Tb is formed. In this trench Tb, an interlayer insulating film (not illustrated) is implanted. Further, the source line contact LI described above is formed passing through the interlayer insulating film. Here, the local source lines LSL may be divided by blocks, or may be disposed in a stripe shape at a predetermined pitch to have the longitudinal direction in the Y direction, similarly to the bit lines BL.

FIG. 3A is an equivalent circuit diagram of one NAND cell unit NU. In this memory cell array 11, one NAND cell unit NU includes the memory string MS constituted of a plurality of the memory cells MC and dummy cells DMC1 and DMC2. The one NAND cell unit NU also includes the drain-side selection transistor S1 and the source-side selection transistor S2. The drain-side selection transistor S1 is coupled between the upper end of the memory string MS and the bit line BL. The source-side selection transistor S2 is coupled between the lower end of the memory string MS and the local source line LSL.

FIG. 3B illustrates one example of a specific structure of one of the memory cell MC and the dummy cell DMC. The semiconductor layer 23 includes an oxide-film core 26 and the semiconductor film 25 that surrounds the peripheral area of the oxide-film core 26. The oxide-film core 26 is formed of, for example, a silicon oxide film ($SiO_2$). The semiconductor film 25 is formed of, for example, silicon (Si), silicon-germanium (SiGe), silicon carbide (SiC), germanium (Ge), or carbon (C).

In the peripheral area of this semiconductor film 25, a tunnel insulating film 103, an electric charge accumulating layer 104, and a block insulating film 105 are formed as the memory film 24 to surround this semiconductor film 25. The tunnel insulating film 103 and the block insulating film 105 are constituted of, for example, silicon oxide films (SiOx). The electric charge accumulating layer 104 is constituted of, for example, a silicon nitride film (SiN), and has a function that traps electrons injected from the semiconductor film 25 via the tunnel insulating film 103 by a write operation. In this example, the tunnel insulating film 103 and the electric charge accumulating layer 104 are illustrated to be formed on the entire side surface of the semiconductor film 25. This, however, should not be construed in a limiting sense. The tunnel insulating film 103 and the electric charge accumulating layer 104 can be formed only on the side surface of the word line WL. The memory film 24 need not surround the semiconductor film 25 over the whole circumference (360°), and may have a structure that only surrounds a part of the semiconductor film 25. On the side surface of the block insulating film 105, the interlayer insulating film 21 and the conductive film 22 described above are alternately laminated.

Here, the materials of the tunnel insulating film 103 and the block insulating film 105 can employ, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAiO, ZrSiO, ZrAlO, and AlSiO other than the silicon oxide film (SiOx).

Figure 4:
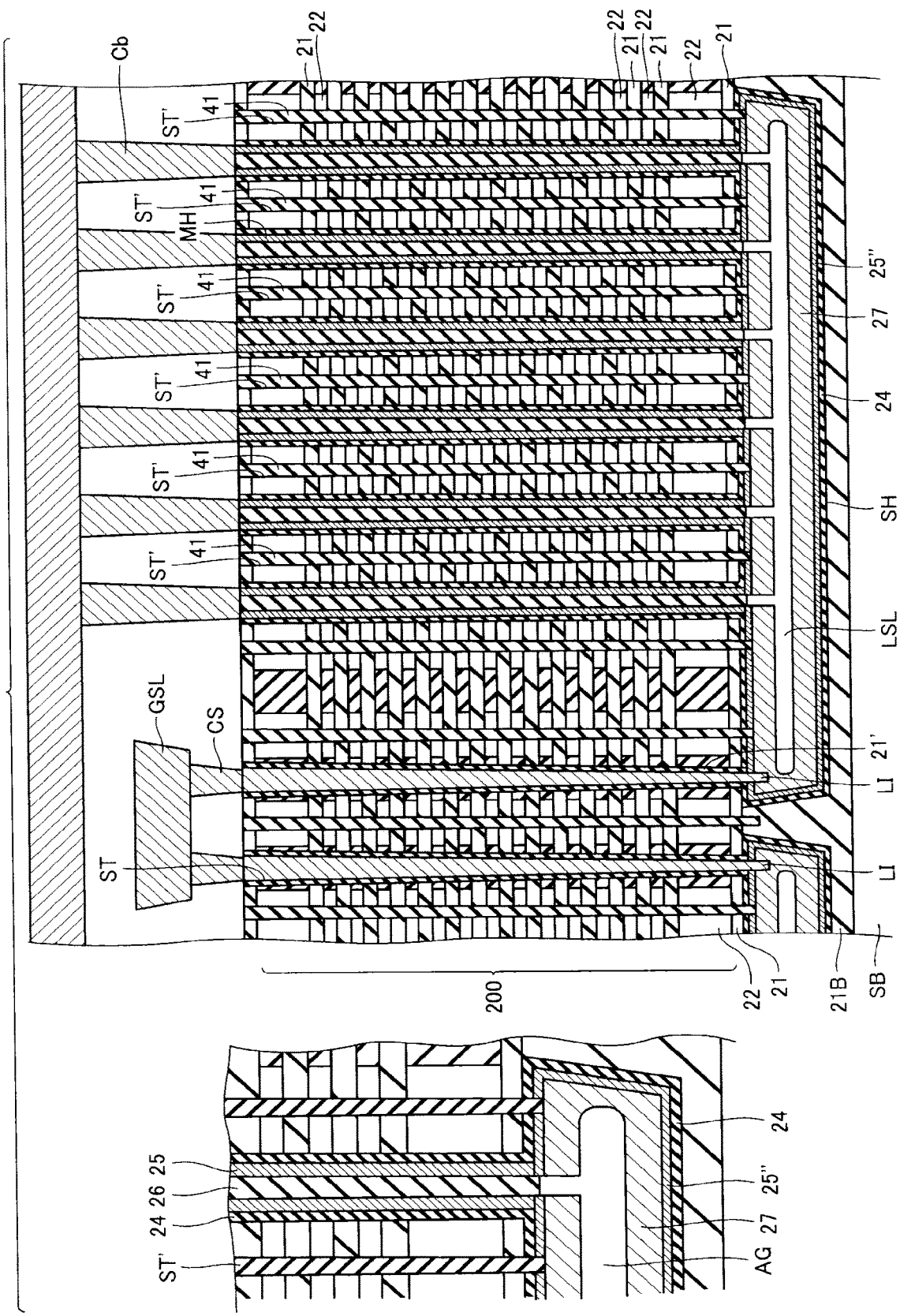
FIG. 4 is a cross-sectional view for describing a detailed structure of the memory cell array 11 and a local source line LSL of the first embodiment.

The following describes the detail of the structures of the memory cell array 11 and the local source line LSL with reference to a cross-sectional view of FIG. 4. FIG. 4 is a cross-sectional view of the portion including the memory cell array 11 and the local source line LSL along the Y direction. This cross-section structure illustrated in FIG. 4 is repeatedly formed in the X direction.

As illustrated in FIG. 4, an element isolation insulating film 21B is implanted on the surface of the semiconductor substrate SB. On the surface of this element isolation insulating film 21B, a trench SH is formed. In the trench SH, the above-described local source line LSL is implanted. The local source line LSL has an end portion coupled to a source line contact LI, and is coupled to the global source line GSL via this source line contact LI.

Here, the trench SH is divided by blocks in this illustration example. This, however, should not be construed in a limiting sense. For example, the trenches SH may have stripe shapes (line shapes) that extend in the Y direction and are collocated at a predetermined pitch in the X direction, similarly to the bit line BL. Here, the width in the lamination direction (the Z direction) of the trench SH is set to be larger than the width of a memory hole MH in the X and Y directions.

On the upper side of the semiconductor substrate SB, that is, on the upper side of the local source line LSL, the interlayer insulating films 21 and the conductive films 22 are alternately laminated so as to form the laminated body 200. The conductive film 22 is a conductive film that functions as the word lines WL, the selection gate line SGS, or the selection gate line SGD, and is formed of, for example, a silicide film. The interlayer insulating film 21 is formed of, for example, silicon oxide.

As through-holes that pass through this laminated body 200 and reach the local source line LSL, the memory holes MH are formed in a matrix on the XY plane. In this memory hole MH, the above-described NAND cell unit NU is formed. Specifically, the memory film 24 (the tunnel insulating film 103, the electric charge accumulating layer 104, and the block insulating film 105) is formed along the inner wall of the memory hole NH. Further, the semiconductor film 25, which is the channel portion of the memory cell MC or similar member, and the oxide-film core 26 are formed along the memory film 24. The upper end of the semiconductor film 25 is coupled to the bit line BL via the contact Cb.

The local source line LSL includes a silicide film 27. The silicide film 27 has an air gap AG inside. This air gap AG may be a simple air gap, or may be filled with another material such as a silicon oxide film. The outer periphery of the silicide film 27 in the local source line LSL is covered with a silicon film 25" and the above-described memory film 24. The memory film 24 is continuously formed without disconnection from the memory cell array side not only on the inner wall of the above-described memory hole MR but also on the inner wall of the trench SH.

Thus, the memory film 24 continues from the NAND cell unit NU without disconnection and reaches the local source line LSL, and is formed in the peripheral area of the silicide film 27 constituting the local source line LSL. This configuration eliminates the need for the process that etches and removes the memory film 24 formed in the bottom portion of the memory hole MH during formation of the NAND cell unit NU. Accordingly, the configuration of the device in the first embodiment allows reducing deterioration of the memory film 24.

In the laminated body 200, a trench ST is formed. The trench ST passes through the laminated body 200 and reaches the end portion of the trench SH. In this trench ST, the above-described source line contact LI is implanted via an interlayer insulating film 21'.

Further, in the region of the memory cell array, trenches ST' are formed at approximately the same array pitch as the array pitch of the memory holes MH on both sides of the memory hole MH (the NAND cell unit NU). In this trench ST', an isolation insulating film 41 is implanted. In the local source line LSL, this isolation insulating film 41 passes through the memory film 24 and reaches the silicide film 27.

(Manufacturing Method)

The following describes a manufacturing method of this non-volatile semiconductor memory device of the first embodiment with reference to FIG. 5 to FIG. 15. Here, for ease of understanding, the dimensions of various members in FIG. 5 to FIG. 15 are set to be different from those in FIG. 4. Like reference numerals designate corresponding or identical elements throughout FIG. 4 to FIG. 15.

Figure 5:
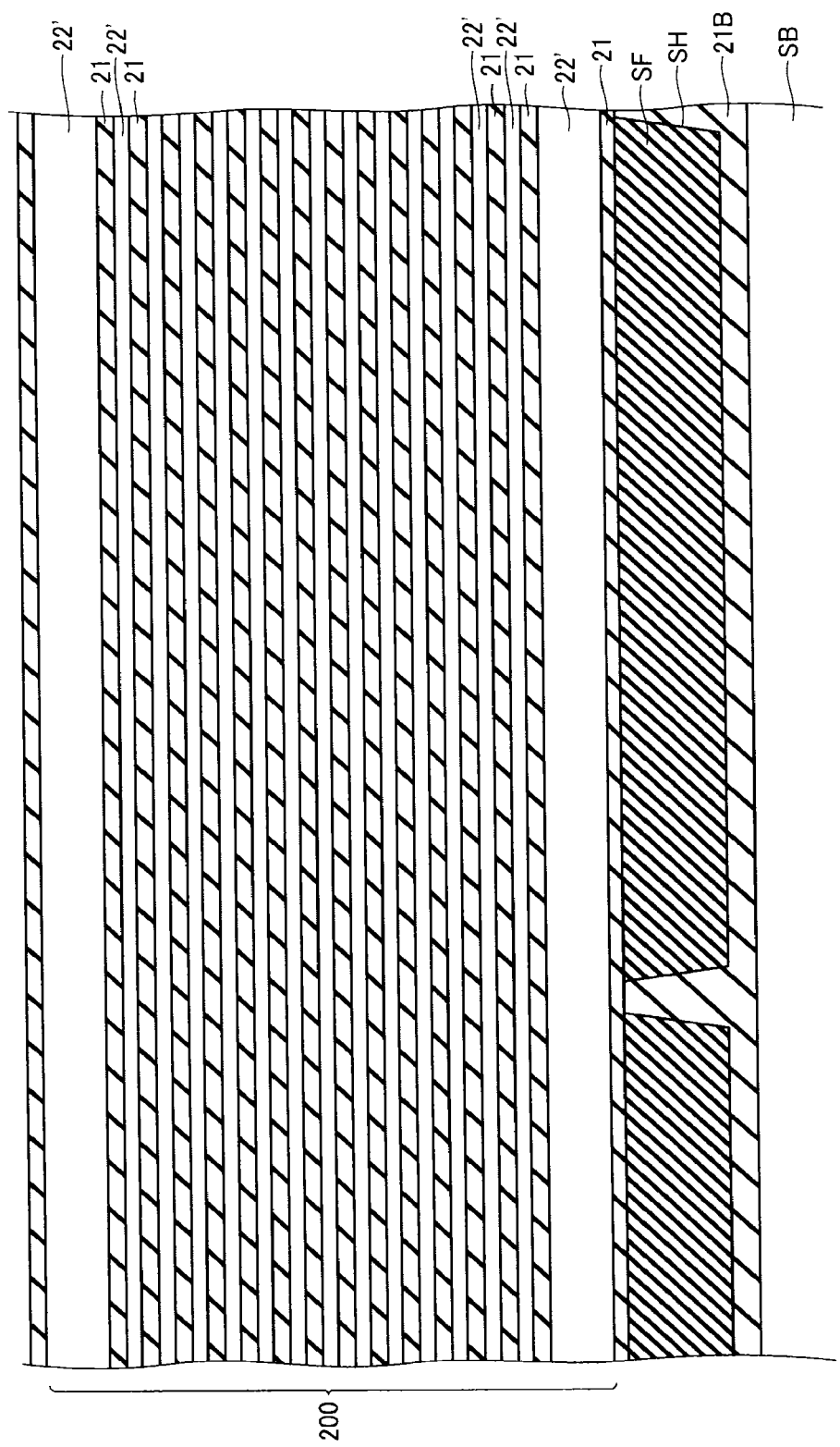
FIG. 5 is a process diagram for describing a manufacturing method of the non-volatile semiconductor memory device of the first embodiment.

Firstly, as illustrated in FIG. 5, the element isolation insulating film 21B is formed on the semiconductor substrate SB. Subsequently, the trench SH is formed on the surface of the element isolation insulating film 21B. Then, in this trench SH, a sacrifice film SF, which is formed of a silicon nitride film (SiN), is implanted. Subsequently, the interlayer insulating films 21 (formed of, for example, silicon oxide films (SiO2)) and conductive films 22' (formed of, for example, polysilicon) are alternately deposited on the semiconductor substrate SB. Thus, the laminated body 200 is formed. The conductive film 22' formed of, for example, polysilicon is silicidized in the subsequent process so as to be changed into the conductive film 22 formed of a silicide film as described later.

Figure 6:
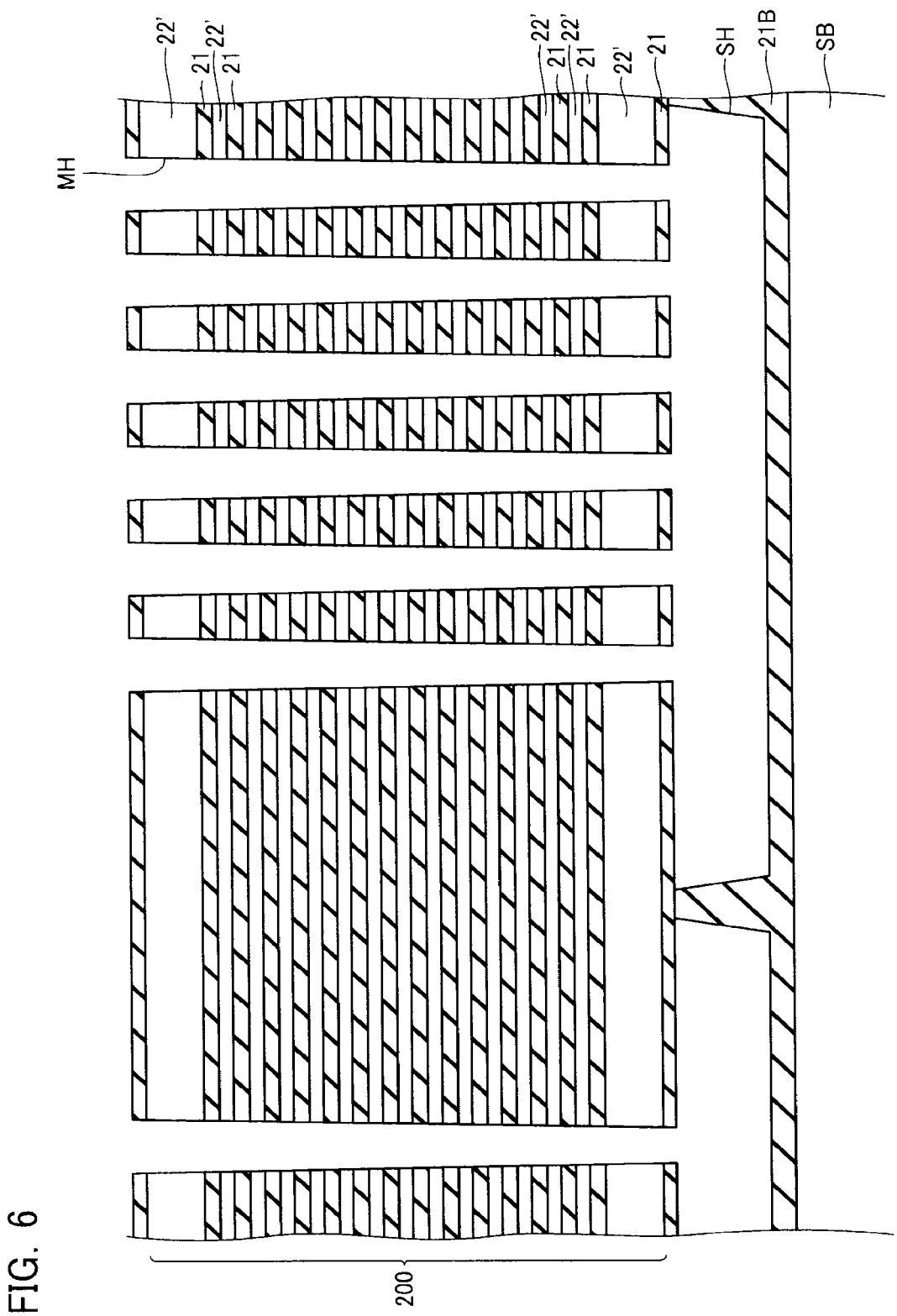
FIG. 6 is a process diagram for describing the manufacturing method of the non-volatile semiconductor memory device of the first embodiment.

Subsequently, as illustrated in FIG. 6, the multiple memory holes MH are formed in a matrix on the XY plane so as to pass through the laminated body 200 and reach the trench SH. After the memory holes MH are formed, wet etching is performed to remove the sacrifice film SF.

Figure 7:
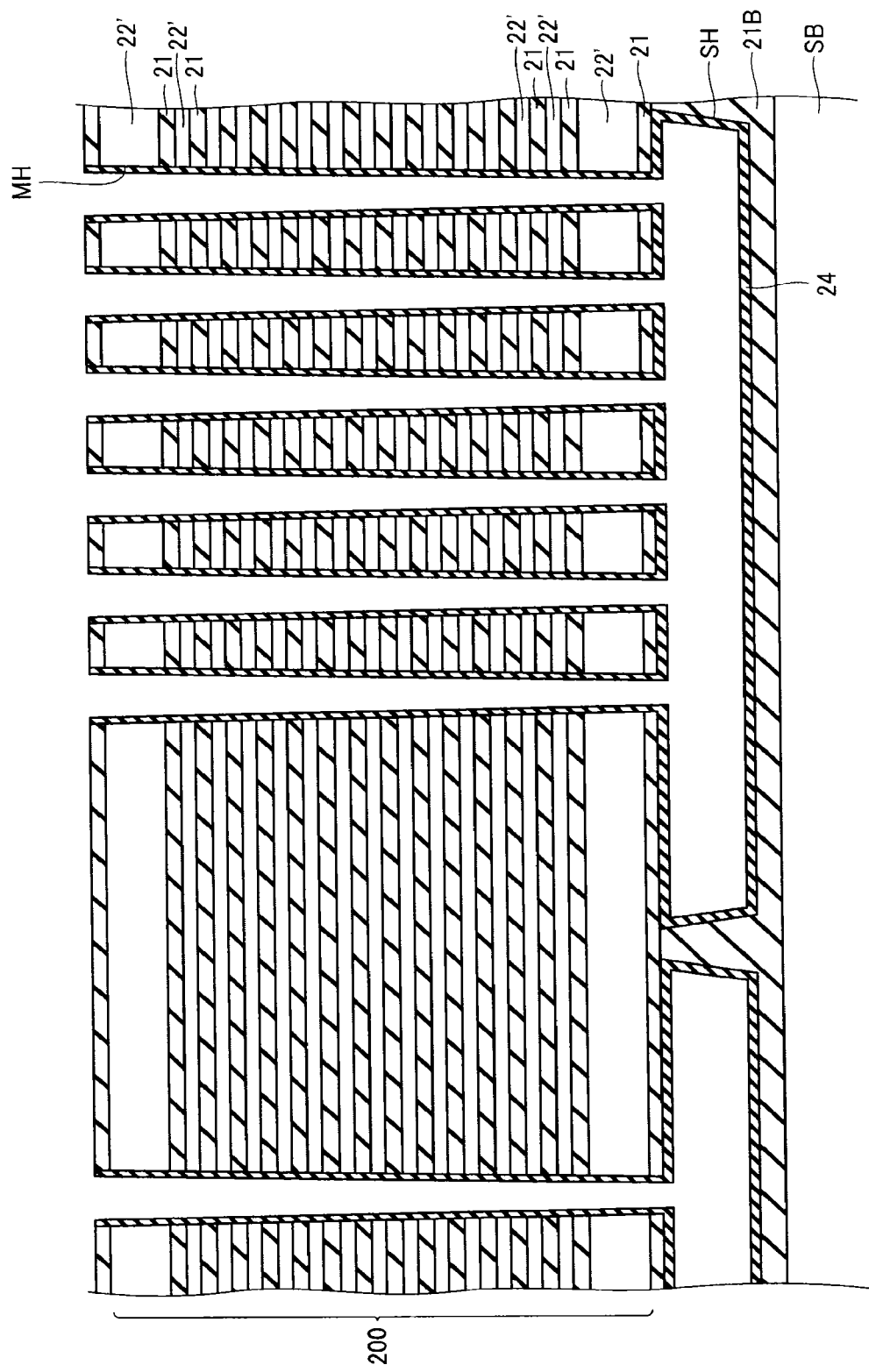
FIG. 7 is a process diagram for describing the manufacturing method of the non-volatile semiconductor memory device of the first embodiment.

Subsequently, as illustrated in FIG. 7, the above-described memory film 24 is formed along the inner walls of the memory holes MH and the trench SH. The memory film 24 is continuously formed without disconnection even at the boundary between the memory hole MH and the trench SH.

Figure 8:
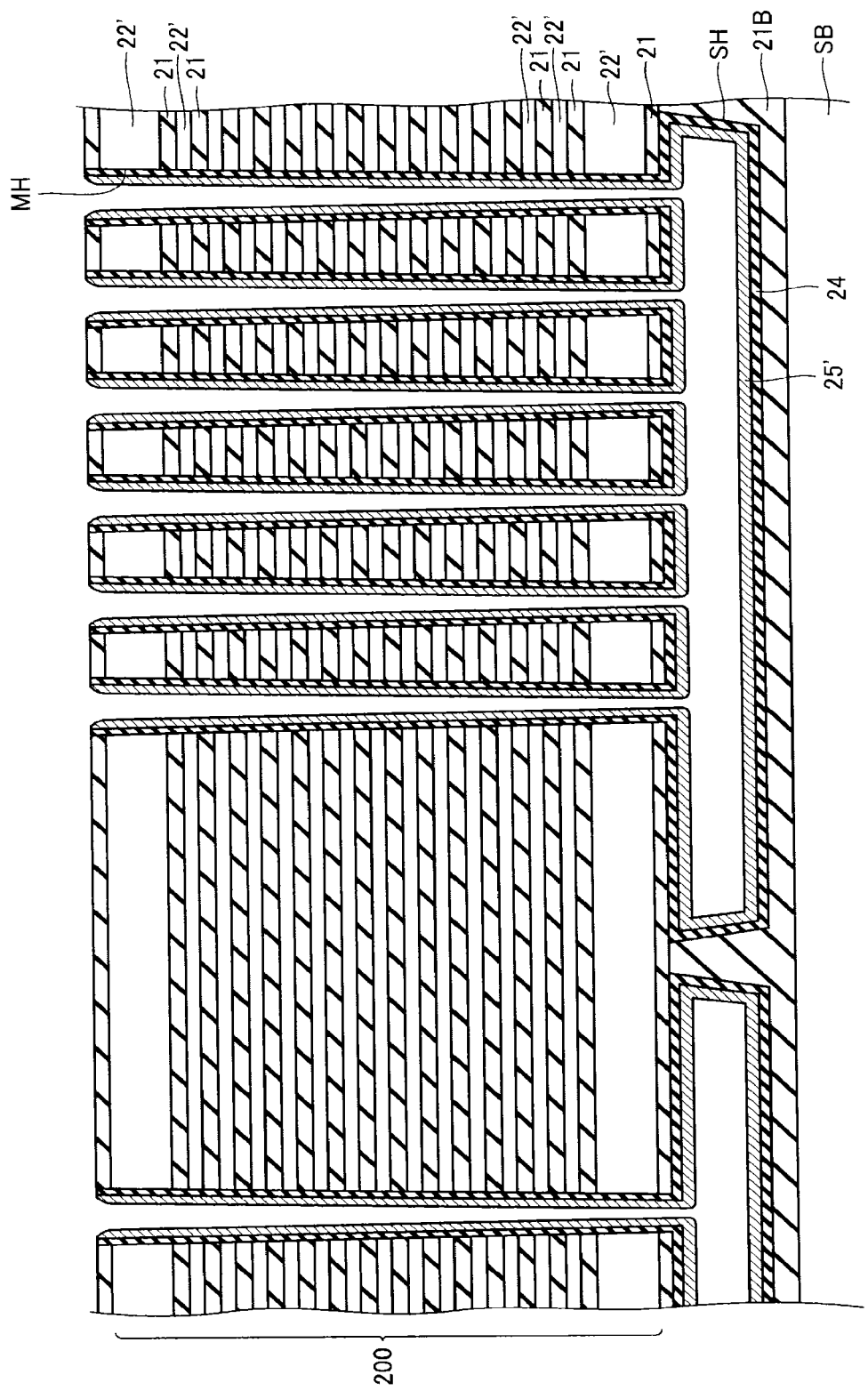
FIG. 8 is a process diagram for describing the manufacturing method of the non-volatile semiconductor memory device of the first embodiment.

Subsequently, as illustrated in FIG. 8, a silicon film 25' is deposited inside the memory holes MH and the trench SH via the memory film 24. At this time, the film thickness of the silicon film 25' is adjusted such that the memory holes MH and the trench SH are not closed by the silicon film 25' and leave air gaps inside them.

Figure 9:
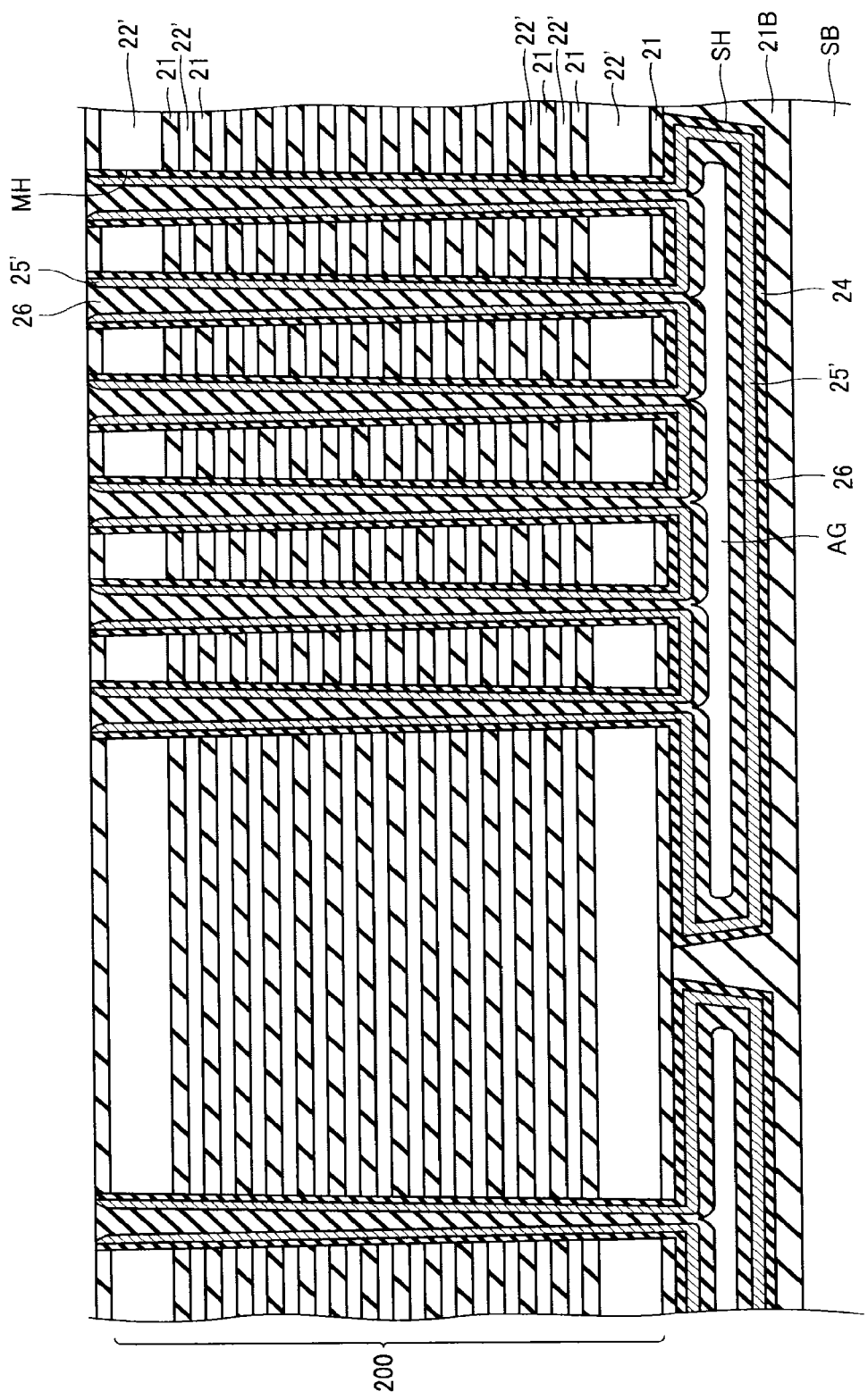
FIG. 9 is a process diagram for describing the manufacturing method of the non-volatile semiconductor memory device of the first embodiment.

Subsequently, as illustrated in FIG. 9, the above-described oxide-film core 26 is formed inside the memory holes MH and the trench SH. The oxide-film core 26 closes the memory holes MH. In contrast, the trench SH with the width larger than that of the memory hole MH is not closed by this oxide film core 26. The air gap AG is left inside the oxide-film core 26.

Figure 10:
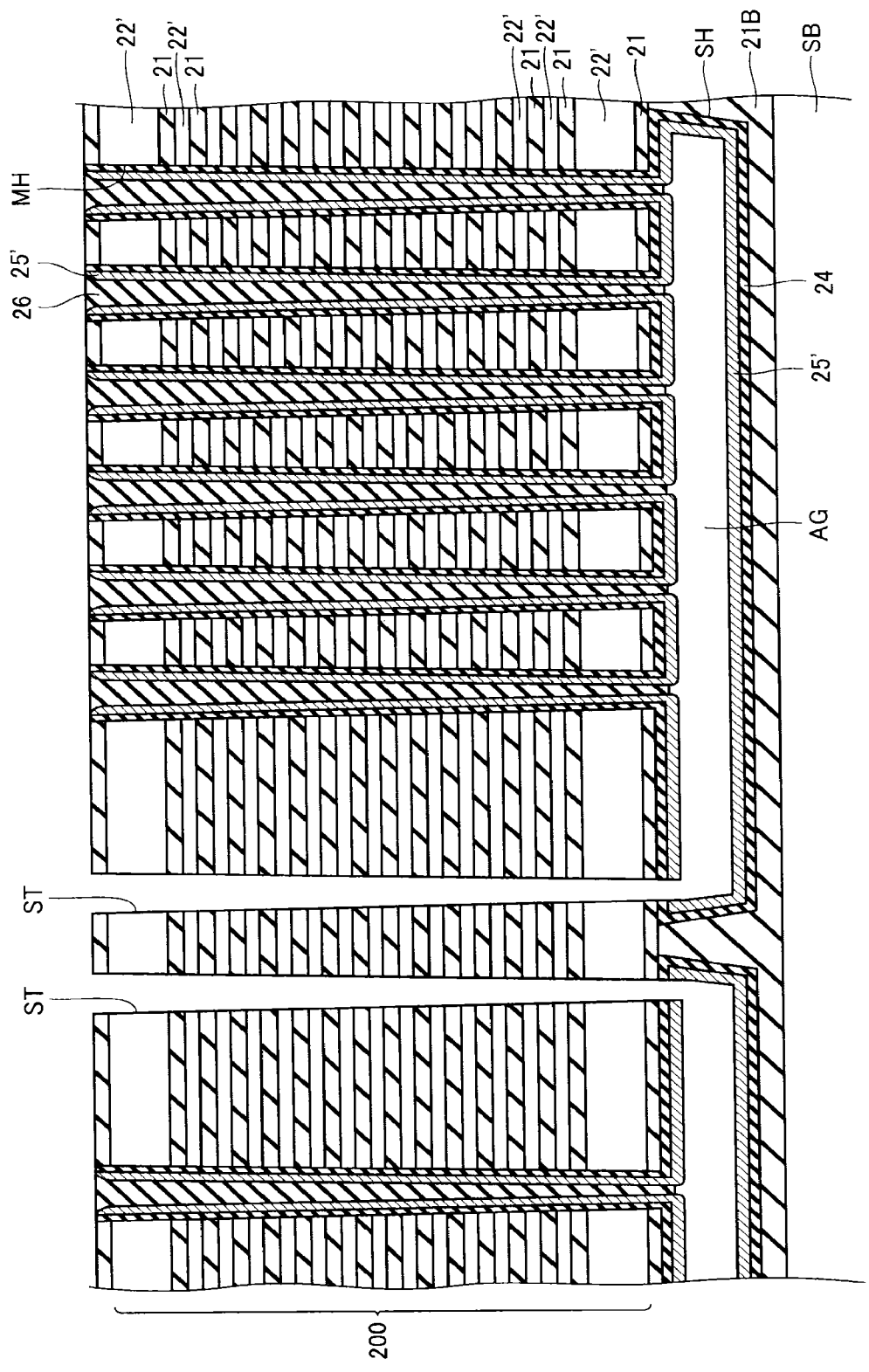
FIG. 10 is a process diagram for describing the manufacturing method of the non-volatile semiconductor memory device of the first embodiment.

Subsequently, as illustrated in FIG. 10, the trenches ST are formed. The trench ST passes through the laminated body 200 and reaches the end portion of the trench SH. The trench ST is formed to pass through the memory film 24, the silicon film 25' and the oxide-film core 26 that are already formed in the trench SH so as to reach the air gap AG left inside the oxide-film core 26. Subsequently, wet etching is performed through this trench ST so as to remove the oxide-film core 26 formed inside the trench ST.

Figure 11:
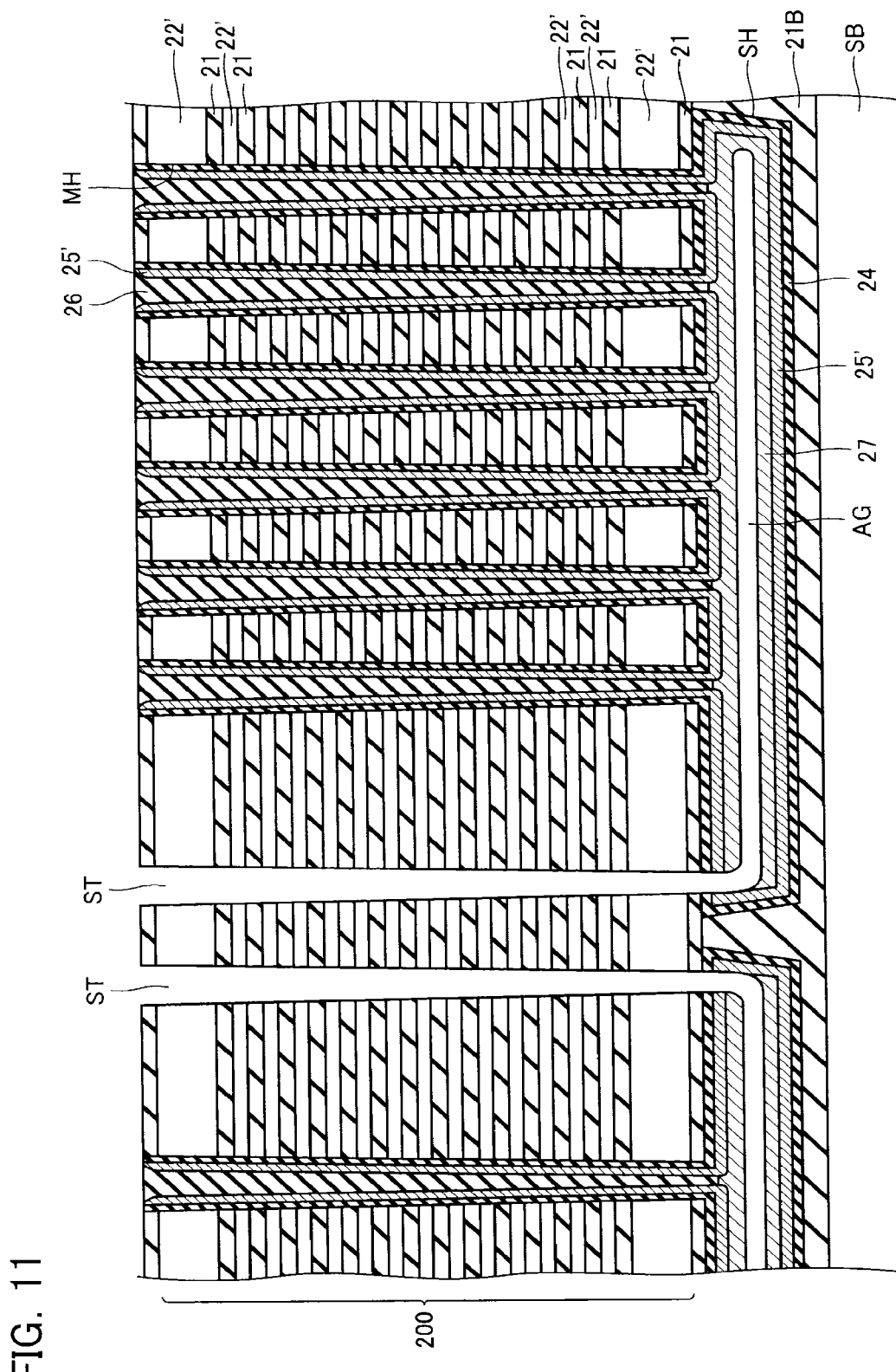
FIG. 11 is a process diagram for describing the manufacturing method of the non-volatile semiconductor memory device of the first embodiment.
Figure 12:
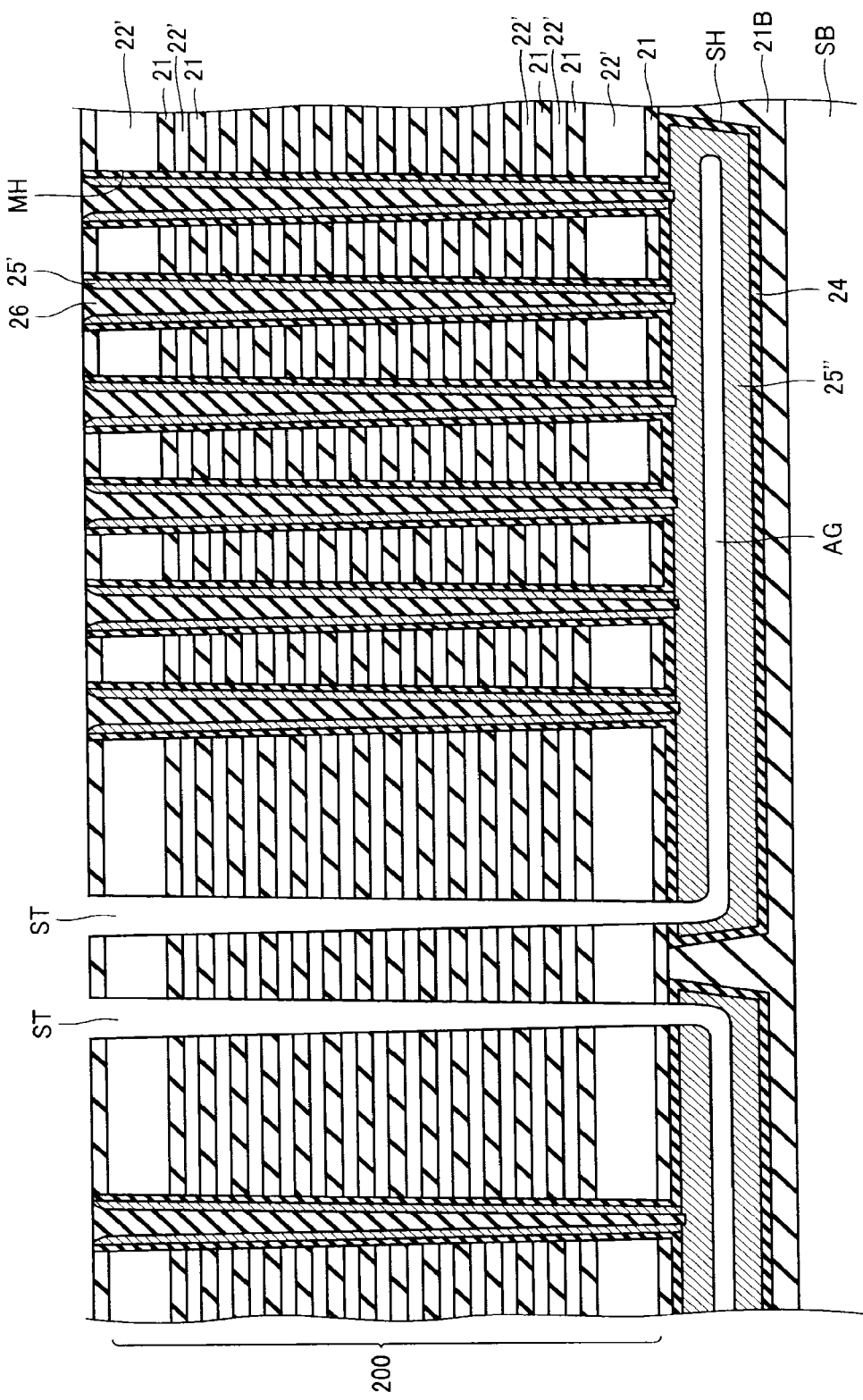
FIG. 12 is a process diagram for describing the manufacturing method of the non-volatile semiconductor memory device of the first embodiment.

Subsequently, as illustrated in FIG. 11, the silicide film 27 with a high concentration of impurities (such as boron (B)) is formed along the silicon film 25' inside the trench SH through the trench ST. In this state, a thermal process is performed such that the impurities in the silicide film 27 are diffused within the silicon film 25', so as to form the silicon film 25" (diffusion layer) (see FIG. 12).

Figure 13:
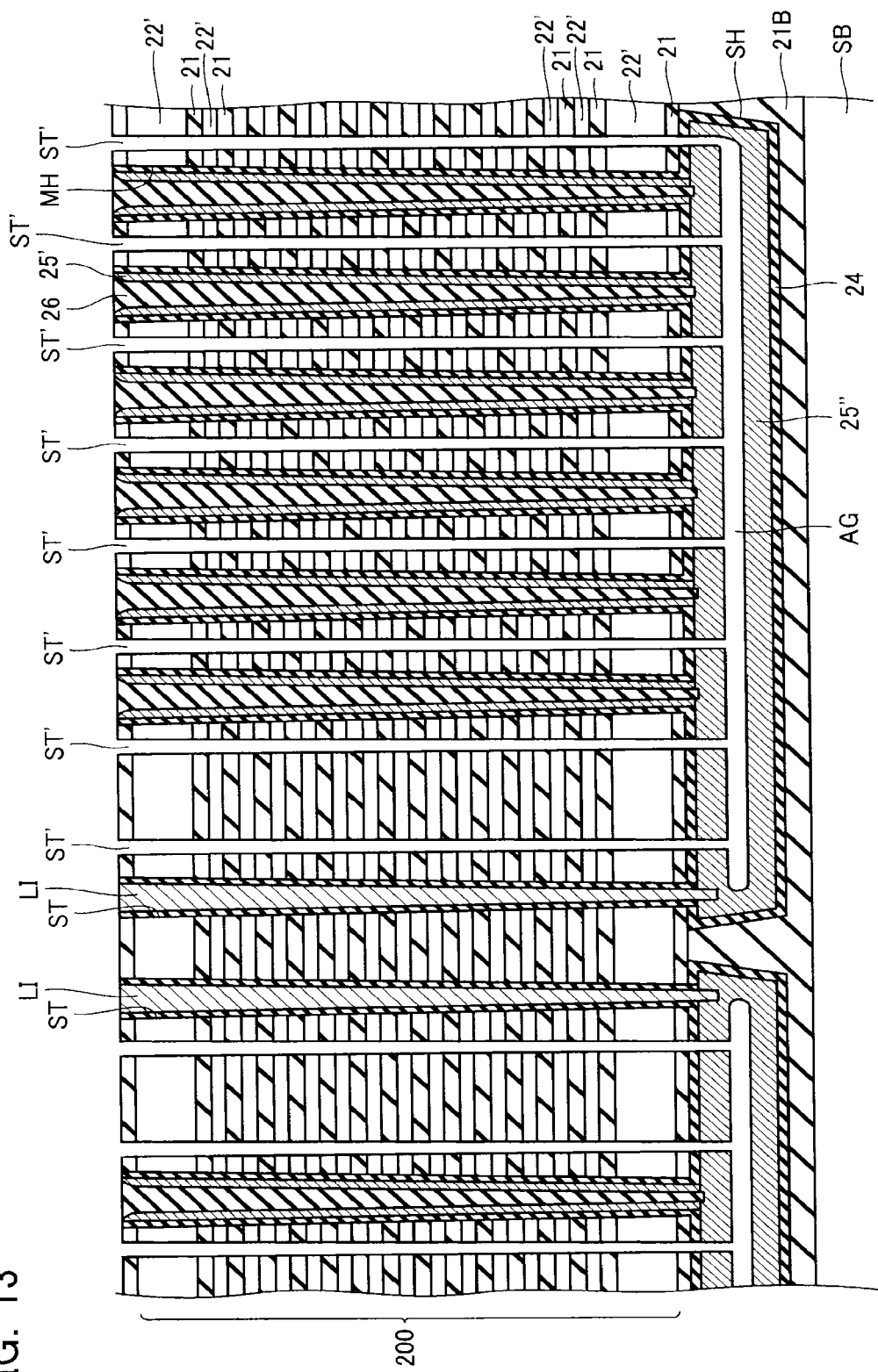
FIG. 13 is a process diagram for describing the manufacturing method of the non-volatile semiconductor memory device of the first embodiment.

Subsequently, as illustrated in FIG. 13, the contact LI is formed in the trench ST. Subsequently, a plurality of trenches ST' are formed at approximately regular intervals along the Y direction. The trench ST' passes through the laminated body 200 and reaches the silicon film 25' inside the trench SH. In this example, the trenches ST' are disposed at approximately the same array pitch as the array pitch of the memory holes MH so as to be sandwiched between the memory holes MH. This, however, should not be construed in a limiting sense.

Figure 14:
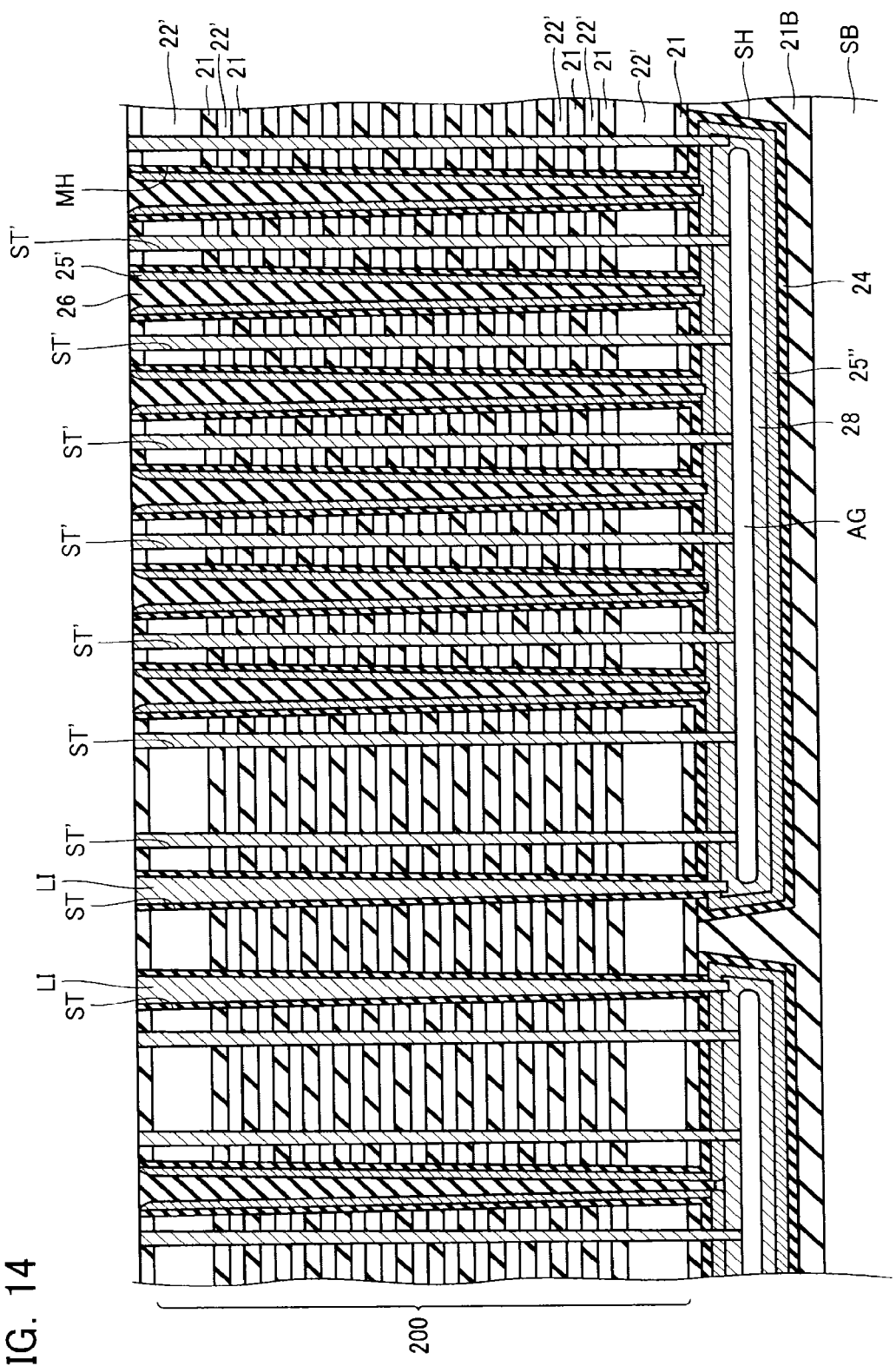
FIG. 14 is a process diagram for describing the manufacturing method of the non-volatile semiconductor memory device of the first embodiment.
Figure 15:
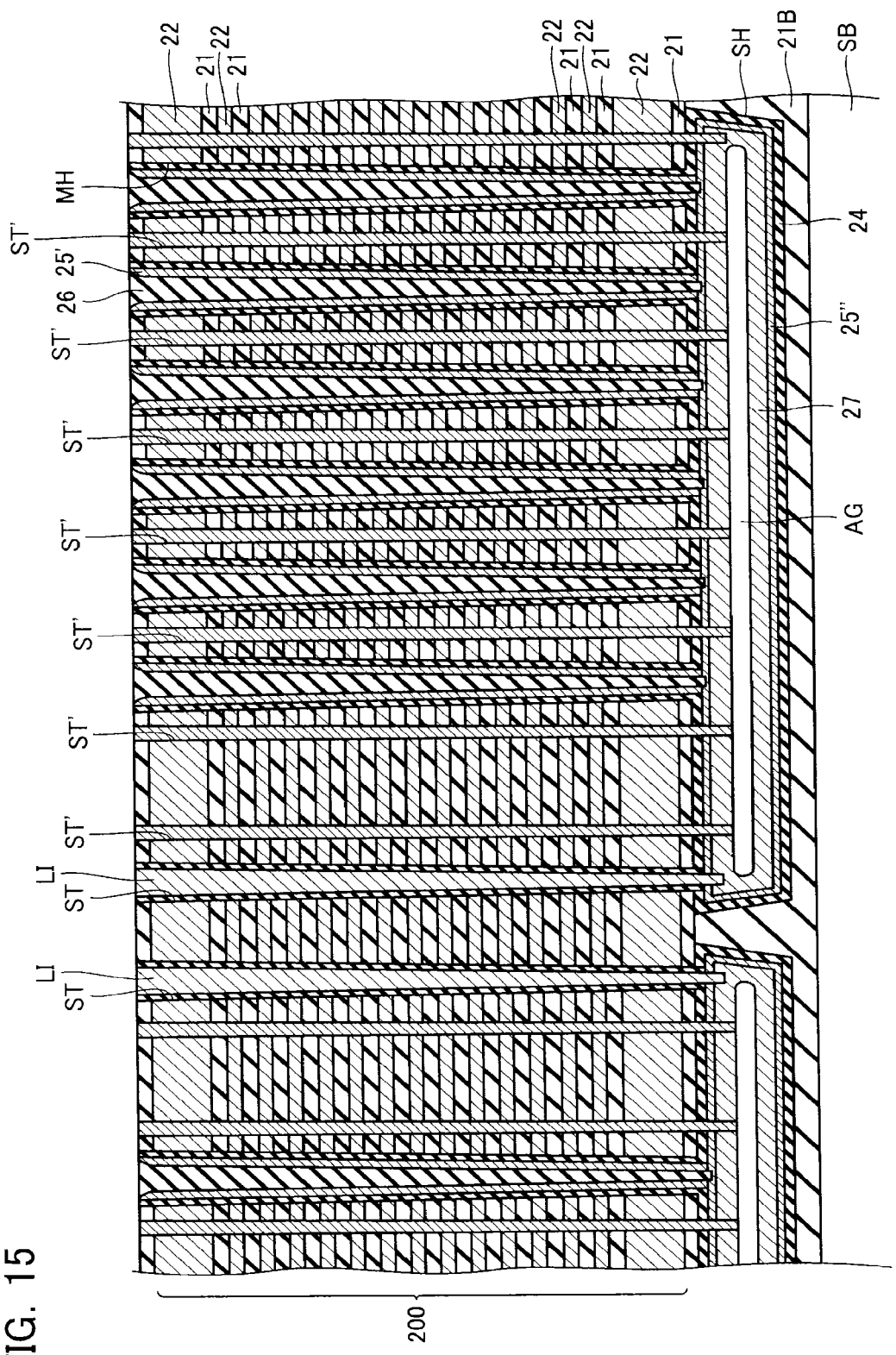
FIG. 15 is a process diagram for describing the manufacturing method of the non-volatile semiconductor memory device of the first embodiment.

After the trench ST' is formed, as illustrated in FIG. 14, a metal film 28 is deposited inside these trenches ST' and inside the trench SH. The metal film 28 is formed of, for example, nickel (Ni) or cobalt (Co). Subsequently, a silicidation process is performed to cause a reaction between the metal film 28 and the silicon film 25" so as to form the silicide film 27 (see FIG. 15). Here, in the trench SH, a part of the silicon film 25" is preferred not to be silicidized so as to be left as a silicon film. The left silicon film 25" (diffusion layer) functions as a source/drain diffusion layer of the selection transistor S2, and is located between the memory film 24 and the silicide film 27. By this silicidation process, polysilicon constituting the conductive film 22' is also changed into the conductive film 22 formed of a silicide film.

After the silicidation process is terminated, the metal film 28 left in the trench ST' is removed by etching. The isolation insulating film 41 formed of a silicon oxide film or similar film is implanted in the trench ST' (see FIG. 4). Since the trench ST' is formed as described above, the isolation insulating film 41 is finally formed in the shape that passes through the memory film 24 and reaches the silicide film 27. Subsequently, upper-layer wiring is formed with a known method so as to complete the structure in FIG. 4.

Effects

As described above, the non-volatile semiconductor memory device of the first embodiment includes the local source line LSL, which is coupled to the lower end of the NAND cell unit NU formed in the memory hole ME. This local source line LSL includes the silicide film 27 having the hollow portion inside. The peripheral area of the local source line LSL is covered with the memory film 24 continuously formed from the inside the NAND cell unit NU. The presence of the silicide film 27 causes reduction in resistance value of the local source line LSL.

Further, the memory film 24 is continuously formed from the memory cell array. Accordingly, after the memory film 24 is formed in the memory hole MH, it is not necessary to perform etching for peeling off the memory film 24 in the bottom portion (near the contact point between the memory hole MH and the trench SH) of the memory hole MH. This allows reducing the deterioration of the memory film 24, so as to improve the operating characteristics of the memory cell.

Second Embodiment

Figure 16:
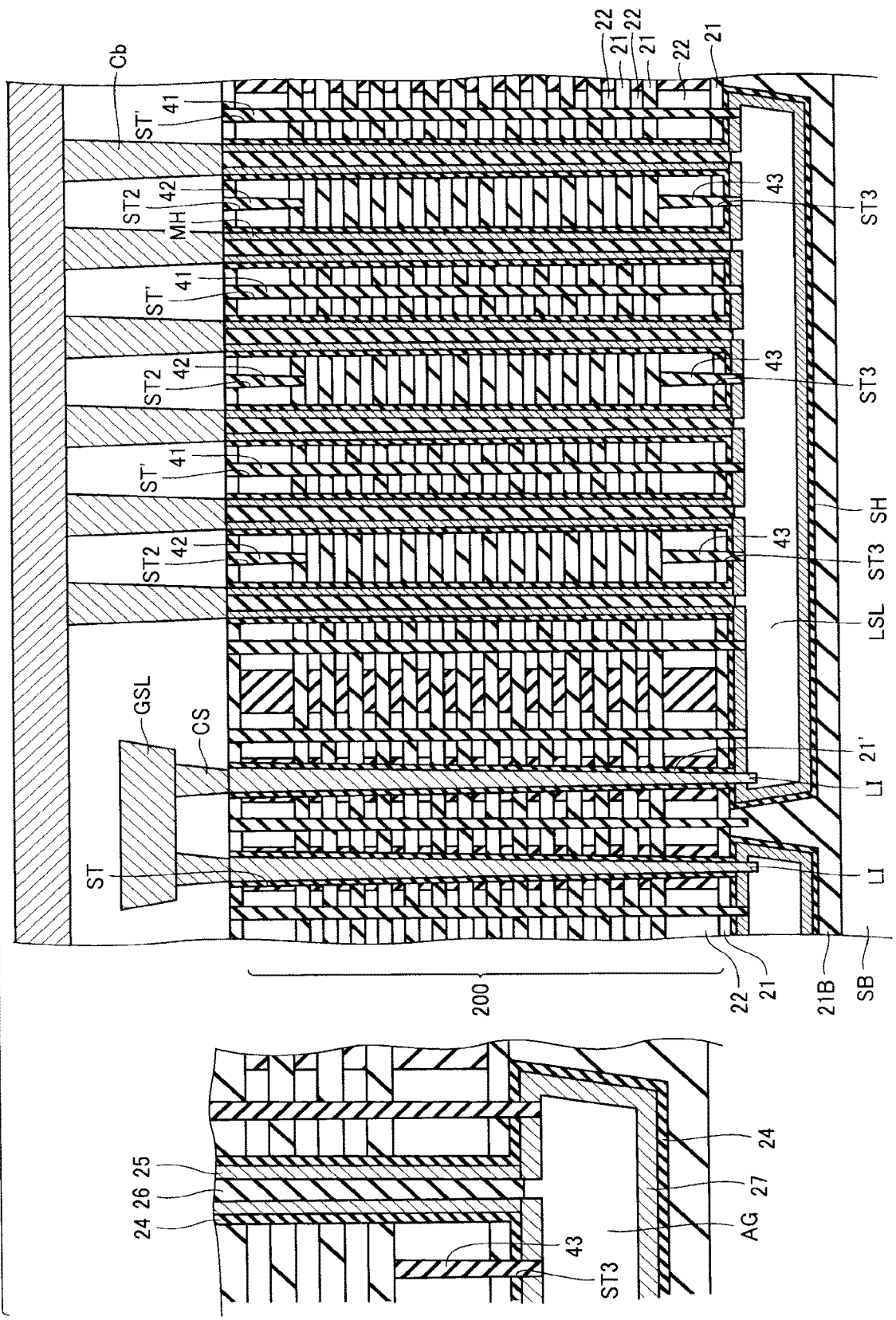
FIG. 16 is a cross-sectional view for describing a detailed structure of the memory cell array 11 and the local source line LSL of a second embodiment.
Figure 17:
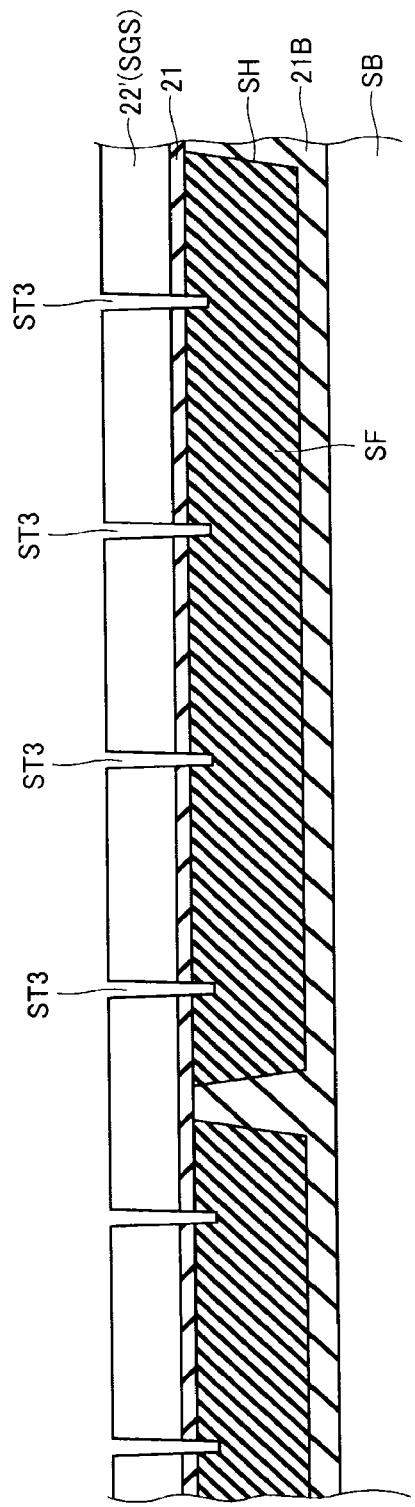
FIG. 17 is a process diagram for describing a manufacturing method of a non-volatile semiconductor memory device of the second embodiment.

The following describes the non-volatile semiconductor memory device according to a second embodiment with reference to FIG. 16. The overall configuration of the device is approximately the same as that of the first embodiment. However, this second embodiment differs from the first embodiment (FIG. 4) in the cross-section structure of the memory cell array. Like reference numerals designate corresponding or identical configurations the first embodiment and FIG. 16, and therefore such configurations will not be further elaborated here.

As illustrated in FIG. 16, in the second embodiment, the array pitch of the trenches ST', which pass through the laminated body 200 and reach the trench SH, is doubled compared with the first embodiment. In other words, while the trench ST' is disposed on both sides of each memory hole MH in the first embodiment, the trench ST' is arranged only on one side of each memory hole MH in this second embodiment.

Instead, in the position where the trench ST' is omitted, a trench ST2 and a trench ST3 are disposed. The trench ST2 is formed for separating only the selection gate lines SGD (the conductive films 22 in the uppermost layer), which are coupled to the drain-side selection transistors S1, inside the laminated body 200. The trench ST3 is formed for separating only the selection gate lines SGS (the conductive films 22 in the lowermost layer), which are coupled to the source-side selection transistors S2, inside the laminated body 200. That is, the trench ST' and the trench ST2 (or ST3) are alternately disposed in the Y direction. Here, in the trenches ST', ST2, and ST3, respective isolation insulating films 41, 42, and 43 formed of silicon oxide films or similar film are implanted.

The following describes a manufacturing method of the non-volatile semiconductor memory device of this second embodiment with reference to FIG. 17 to FIG. 20.

Firstly, the trench SH and the sacrifice film SF are formed similarly to the first embodiment. Subsequently, on this trench SH, one interlayer insulating film 21 and one conductive film 22 for the source-side selection gate line SGS are deposited. Subsequently, the trenches ST3 are formed at approximately regular intervals. In the trench ST3, the isolation insulating film such as a silicon oxide film is implanted.

Figure 18:
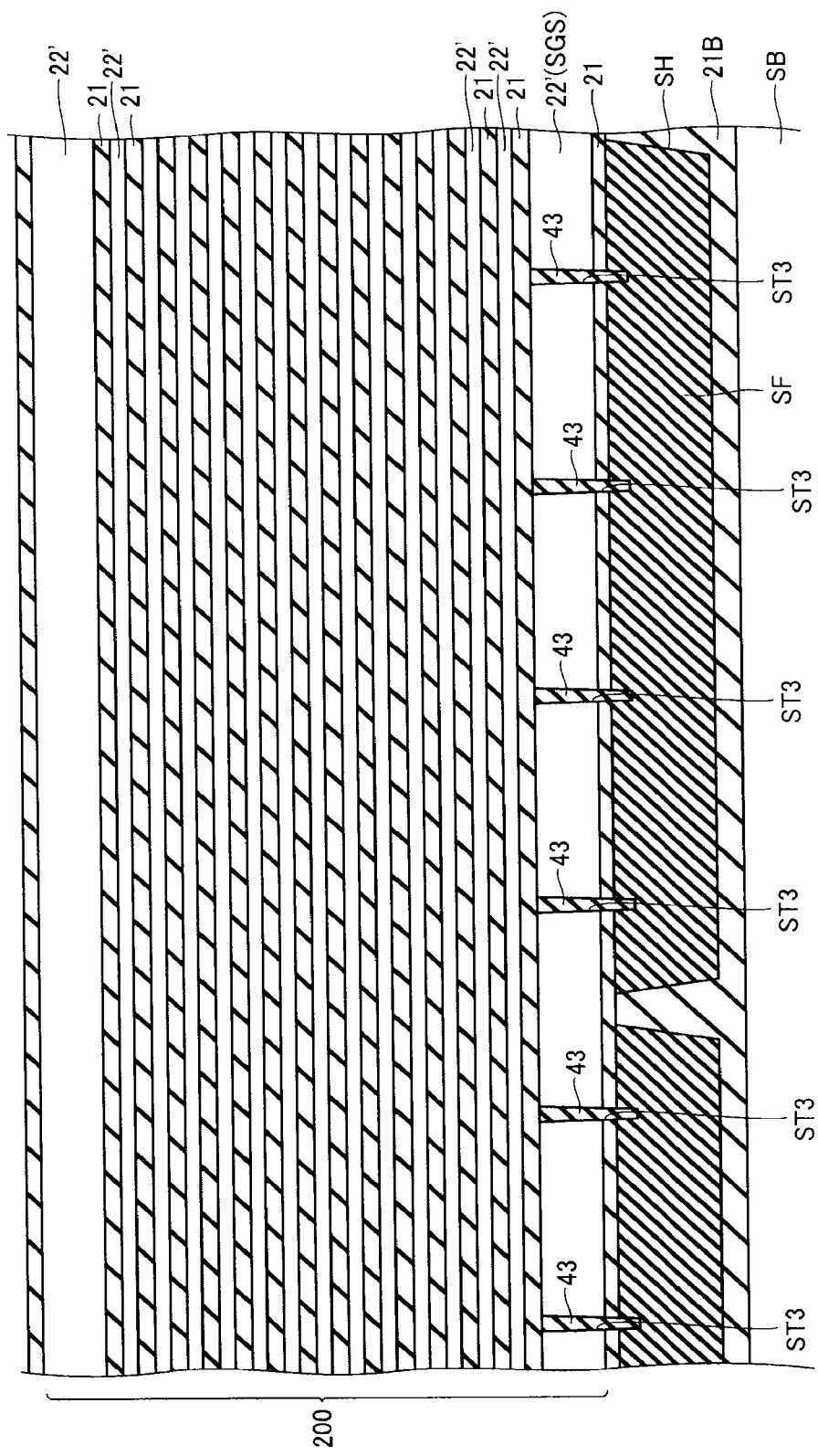
FIG. 18 is a process diagram for describing the manufacturing method of the non-volatile semiconductor memory device of the second embodiment.
Figure 19:
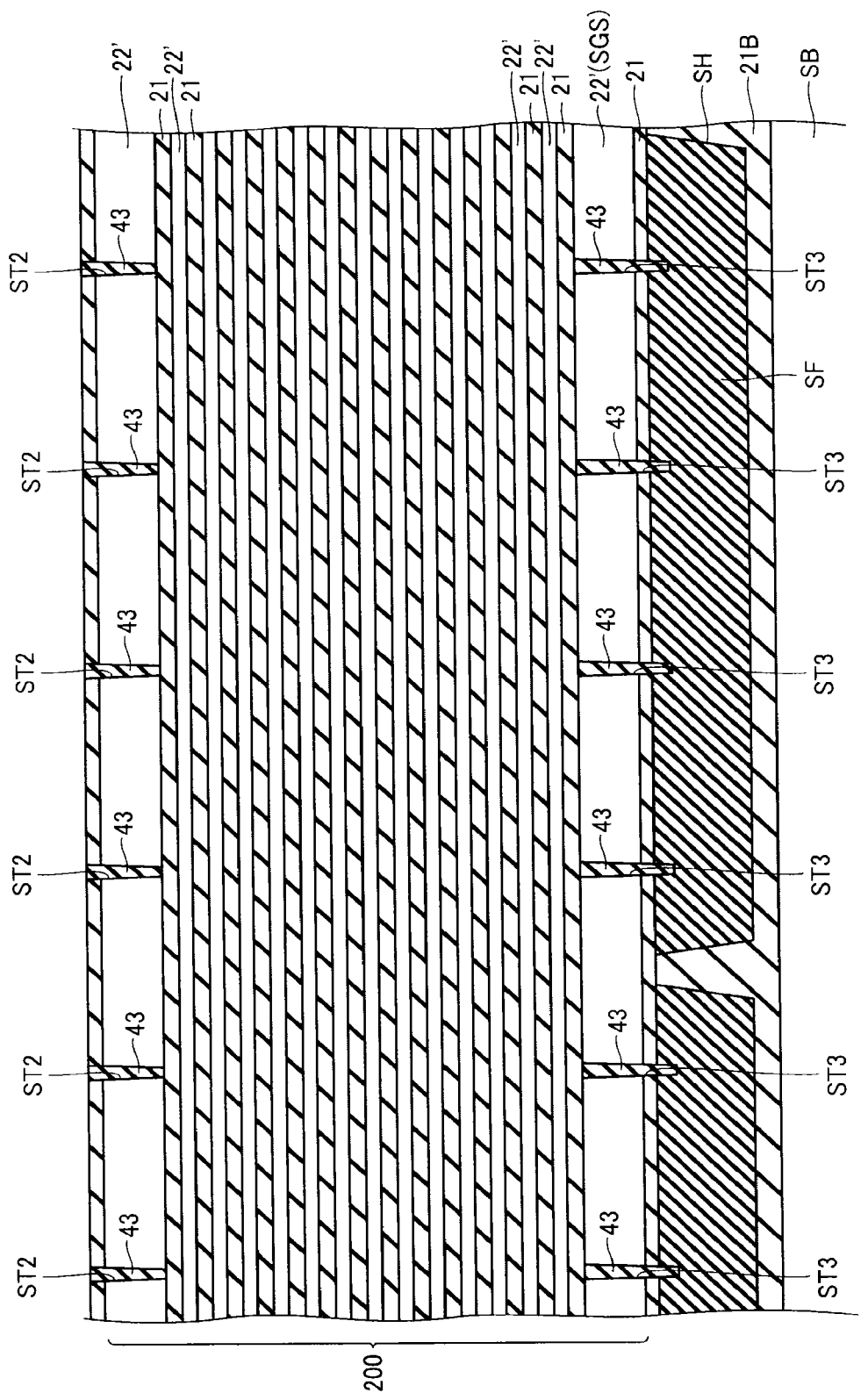
FIG. 19 is a process diagram for describing the manufacturing method of the non-volatile semiconductor memory device of the second embodiment.
Figure 20:
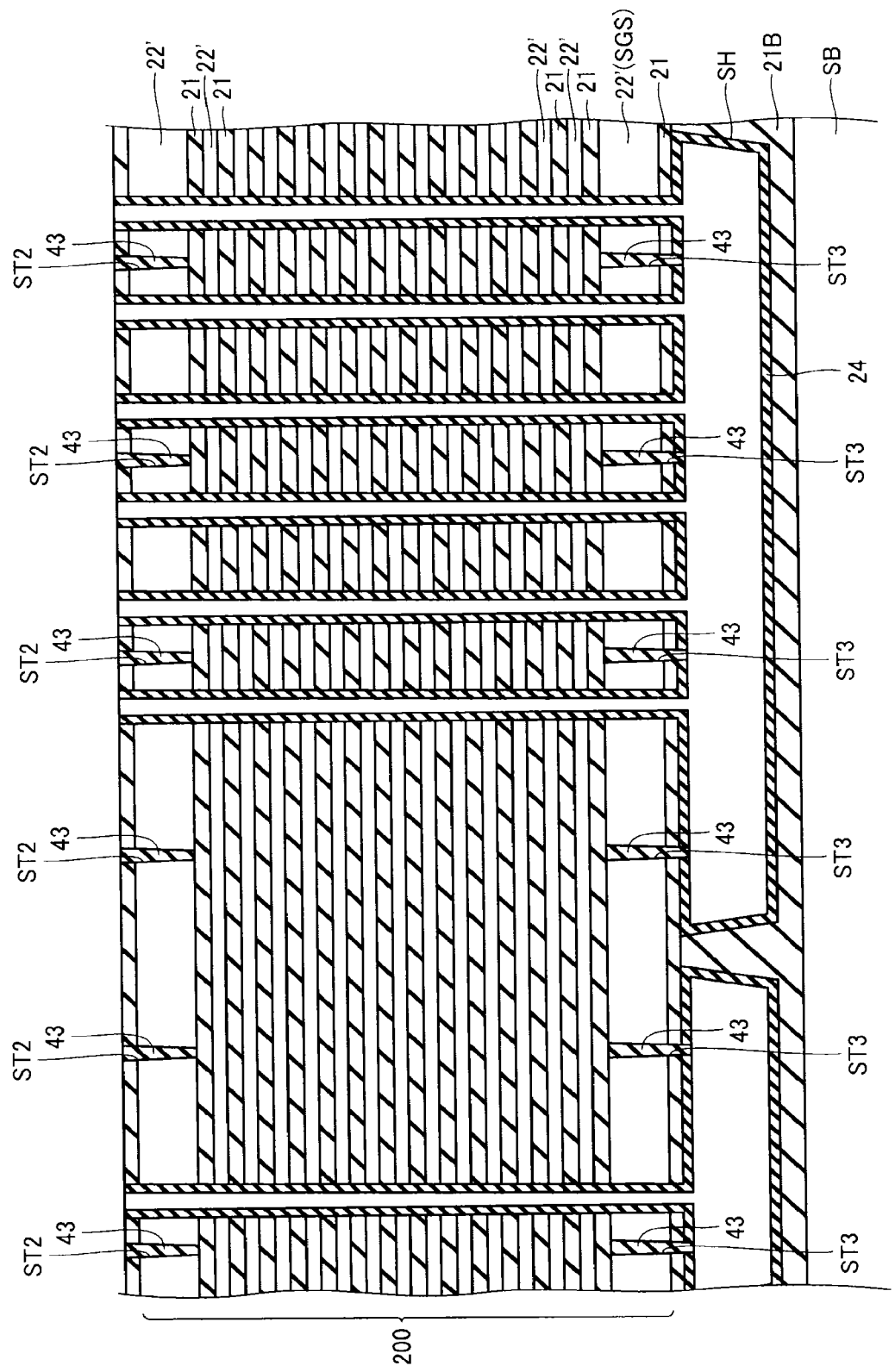
FIG. 20 is a process diagram for describing the manufacturing method of the non-volatile semiconductor memory device of the second embodiment.

Subsequently, as illustrated in FIG. 18, the interlayer insulating films 21 and the conductive films 22 are alternately deposited so as to form the laminated body 200. Subsequently, as illustrated in FIG. 19, in the conductive film 22 in the uppermost layer, that is, the conductive film 22 for the drain-side selection gate line SGD, the trenches ST2 are formed at regular intervals from the trenches ST3 and immediately above the trenches ST3. Also in the trench ST2, the isolation insulating film is implanted.

Figure 21:
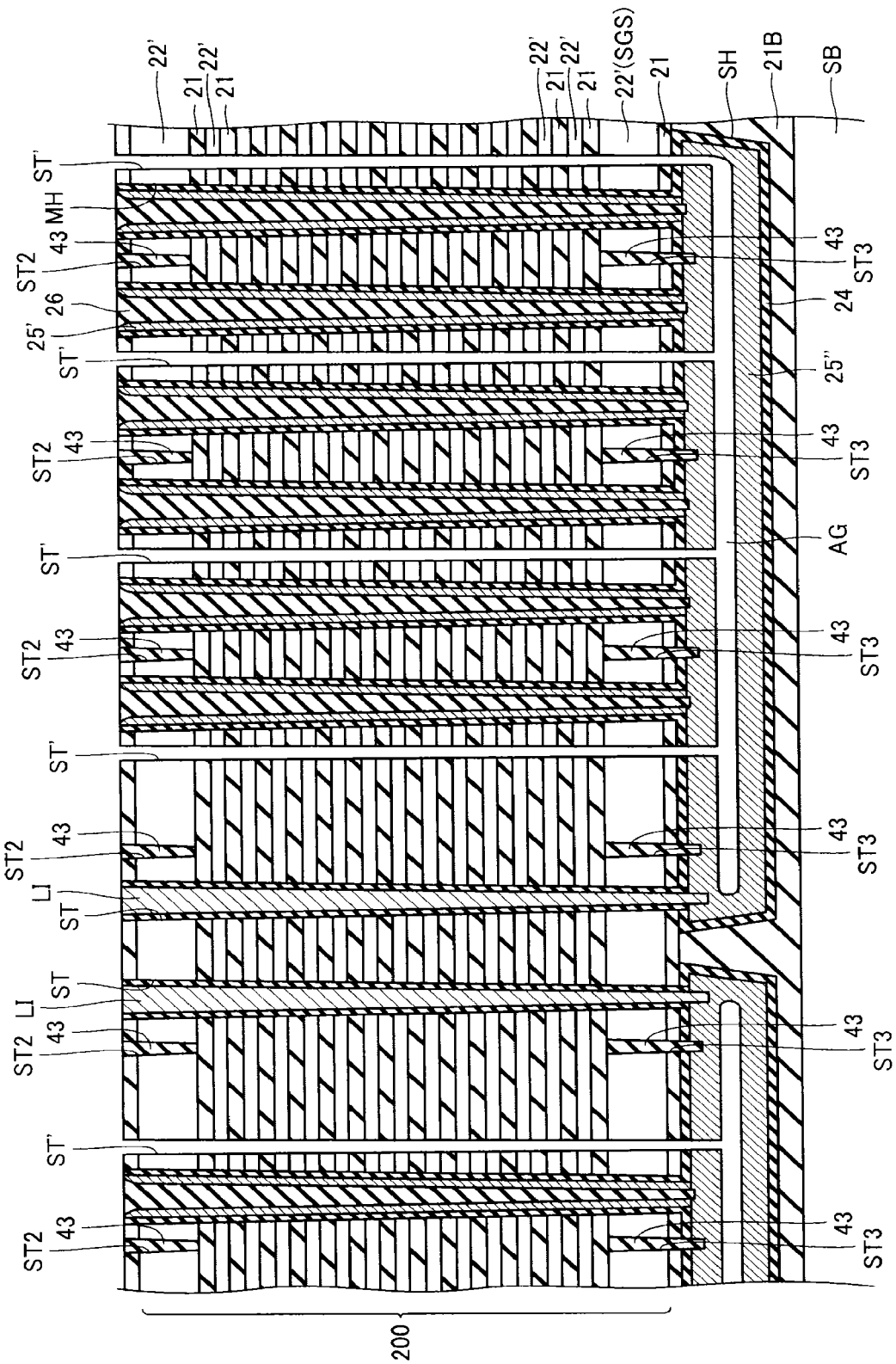
FIG. 21 is a process diagram for describing the manufacturing method of the non-volatile semiconductor memory device of the second embodiment.

Subsequently, similarly to the first embodiment, the memory holes MH are formed so as to form the NAND cell units NU in the similar manner of the first embodiment. Subsequently, as illustrated in FIG. 21, the trenches ST' are formed so as to form the local source line LSL with the same method as that of the first embodiment. The other processes are similar to those in the first embodiment.

This second embodiment allows obtaining the same effects as those in the first embodiment.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

FIG. 1
Lamination Direction
Y (BIT DIRECTION)
X (WORD DIRECTION)

What is claimed is:
1. A non-volatile semiconductor memory device comprising:
   a substrate;
   a laminated body where a plurality of interlayer insulating films and conductive films are alternately laminated in a first direction, the first direction crossing a surface of the substrate;
   a columnar semiconductor film extending in the first direction,
   a memory film provided between the columnar semiconductor film and one of the plurality of conductive films;
   a first film including silicon and metal and provided between the substrate and a lowermost film of the plurality of conductive films;
   a second film including silicon, provided between the first film and the lowermost film of the plurality of conductive films, and being in contact with the first film and one end of the columnar semiconductor film; and
   a first insulating film extending through the laminated body in the first direction, extending in a second direction crossing the first direction, and separating the laminated body in a third direction crossing the first and second directions; wherein the first insulating film extending through the second film in the first direction and being in contact with the first film.

2. The non-volatile semiconductor memory device according to claim 1, further comprising:

a contact extending in the first direction and extending though the second film in the first direction and being in contact with the first film.

3. The non-volatile semiconductor memory device according to claim 1, wherein the first insulating film includes silicon and oxygen.

4. The non-volatile semiconductor memory device according to claim 1, further comprising:

a second insulating film extending inside the laminated body in the first direction and separating only some conductive films of the laminated body.

5. The non-volatile semiconductor memory device according to claim 4, wherein the first insulating film and the second insulating film are alternately disposed along the third direction.

6. The non-volatile semiconductor memory device according to claim 2, wherein one end of the contact is in contact with the first film and another end of the contact is in contact with a global source line.

7. The non-volatile semiconductor memory device according to claim 1, wherein the first film has a hollow portion inside.

8. The non-volatile semiconductor memory device according to claim 1, wherein the second film includes a diffusion layer.

9. The non-volatile semiconductor memory device according to claim 1, wherein the first film extends in the third direction.

* * * * *